United States Patent
Kim et al.

(10) Patent No.: US 10,965,299 B1
(45) Date of Patent: Mar. 30, 2021

(54) DIGITAL-TO-ANALOG CONVERTER AND ELECTRONIC SYSTEM INCLUDING THE SAME

(71) Applicant: Samsung Electronics Co., Ltd., Suwon-si (KR)

(72) Inventors: Jungho Kim, Suwon-si (KR); Michael Choi, Suwon-si (KR); Byungwoo Koo, Suwon-si (KR); Hyungdong Roh, Suwon-si (KR); Sunghan Do, Suwon-si (KR); Youngjae Cho, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/887,535

(22) Filed: May 29, 2020

(30) Foreign Application Priority Data

Nov. 11, 2019 (KR) .......................... 10-2019-0143138

(51) Int. Cl.
  *H03M 1/00* (2006.01)
  *H03M 1/76* (2006.01)
  *H03M 1/06* (2006.01)
  *G06F 7/58* (2006.01)

(52) U.S. Cl.
  CPC ............ *H03M 1/001* (2013.01); *G06F 7/588* (2013.01); *H03M 1/0673* (2013.01); *H03M 1/76* (2013.01)

(58) Field of Classification Search
  CPC ........ H03M 1/066; H03M 1/001; H03M 1/76; H03M 1/0673; H03M 1/464; H03M 1/747; H03M 1/682; H03M 1/685; H03M 1/0648; H03M 1/06; H03M 1/00
  USPC .......................... 341/136, 150, 153, 144, 145
  See application file for complete search history.

(56) References Cited

U.S. PATENT DOCUMENTS

| | | | |
|---|---|---|---|
| 5,535,239 | A | 7/1996 | Padovani et al. |
| 5,546,102 | A | 8/1996 | Scheffer et al. |
| 5,570,307 | A | 10/1996 | Takahashi |
| 5,844,509 | A | 12/1998 | Behrens et al. |
| 5,963,104 | A | 10/1999 | Buer |
| 6,424,283 | B2 | 7/2002 | Bugeja et al. |
| 8,456,342 | B2 | 6/2013 | Wu et al. |
| 8,581,760 | B2 * | 11/2013 | Muhammad .......... H03M 1/201 341/118 |
| 9,094,042 | B2 * | 7/2015 | Onody ................ H03M 1/0648 |
| 9,384,370 | B1 | 7/2016 | Choi |
| 9,413,385 | B2 | 8/2016 | Mulder |

(Continued)

*Primary Examiner* — Lam T Mai
(74) *Attorney, Agent, or Firm* — Harness, Dickey & Pierce, P.L.C.

(57) ABSTRACT

A digital-to-analog converter (DAC) includes a current array having a plurality of unit cells in a plurality of rows and a plurality of columns, an arbitrary switch box and processing circuitry configured to randomly select a subset of rows among the plurality of rows based on a plurality of first row selection signals, the subset of rows including first unit cells among the plurality of unit cells, randomly select one row among the plurality of rows based on a plurality of second row selection signals, select a subset of columns among the plurality of columns based on column selection signals, second unit cells among the plurality of unit cells being included in both the one row and the subset of columns, and generate an analog output signal corresponding to a digital input signal based on the first unit cells and the second unit cells.

20 Claims, 27 Drawing Sheets

(56) References Cited

U.S. PATENT DOCUMENTS

| | | | |
|---|---|---|---|
| 2005/0052297 A1* | 3/2005 | Eloranta | H03M 1/0651 |
| | | | 341/120 |
| 2009/0116288 A1* | 5/2009 | Varkony | G11C 8/14 |
| | | | 365/185.13 |
| 2018/0095930 A1* | 4/2018 | Lu | H03K 19/177 |

* cited by examiner

| UC1 | UC2 | UC3 | UC4 | UC5 | UC6 | UC7 | UC8 |
|---|---|---|---|---|---|---|---|
| UC9 | UC10 | UC11 | UC12 | UC13 | UC14 | UC15 | UC16 |
| UC17 | UC18 | UC19 | UC20 | UC21 | UC22 | UC23 | UC24 |
| UC25 | UC26 | UC27 | UC28 | UC29 | UC30 | UC31 | UC32 |
| UC33 | UC34 | UC35 | UC36 | UC37 | UC38 | UC39 | UC40 |
| UC41 | UC42 | UC43 | UC44 | UC45 | UC46 | UC47 | UC48 |
| UC49 | UC50 | UC51 | UC52 | UC53 | UC54 | UC55 | UC56 |
| UC57 | UC58 | UC59 | UC60 | UC61 | UC62 | UC63 | UC64 |

| UC1 | UC2 | UC3 | UC4 | UC5 | UC6 | UC7 | UC8 |
|---|---|---|---|---|---|---|---|
| UC9 | UC10 | UC11 | UC12 | UC13 | UC14 | UC15 | UC16 |
| UC17 | UC18 | UC19 | UC20 | UC21 | UC22 | UC23 | UC24 |
| UC25 | UC26 | UC27 | UC28 | UC29 | UC30 | UC31 | UC32 |
| UC33 | UC34 | UC35 | UC36 | UC37 | UC38 | UC39 | UC40 |
| UC41 | UC42 | UC43 | UC44 | UC45 | UC46 | UC47 | UC48 |
| UC49 | UC50 | UC51 | UC52 | UC53 | UC54 | UC55 | UC56 |
| UC57 | UC58 | UC59 | UC60 | UC61 | UC62 | UC63 | UC64 |

| UC1 | UC2 | UC3 | UC4 | UC5 | UC6 | UC7 | UC8 |
|---|---|---|---|---|---|---|---|
| UC9 | UC10 | UC11 | UC12 | UC13 | UC14 | UC15 | UC16 |
| UC17 | UC18 | UC19 | UC20 | UC21 | UC22 | UC23 | UC24 |
| UC25 | UC26 | UC27 | UC28 | UC29 | UC30 | UC31 | UC32 |
| UC33 | UC34 | UC35 | UC36 | UC37 | UC38 | UC39 | UC40 |
| UC41 | UC42 | UC43 | UC44 | UC45 | UC46 | UC47 | UC48 |
| UC49 | UC50 | UC51 | UC52 | UC53 | UC54 | UC55 | UC56 |
| UC57 | UC58 | UC59 | UC60 | UC61 | UC62 | UC63 | UC64 |

| UC1 | UC2 | UC3 | UC4 | UC5 | UC6 | UC7 | UC8 |
|---|---|---|---|---|---|---|---|
| UC9 | UC10 | UC11 | UC12 | UC13 | UC14 | UC15 | UC16 |
| UC17 | UC18 | UC19 | UC20 | UC21 | UC22 | UC23 | UC24 |
| UC25 | UC26 | UC27 | UC28 | UC29 | UC30 | UC31 | UC32 |
| UC33 | UC34 | UC35 | UC36 | UC37 | UC38 | UC39 | UC40 |
| UC41 | UC42 | UC43 | UC44 | UC45 | UC46 | UC47 | UC48 |
| UC49 | UC50 | UC51 | UC52 | UC53 | UC54 | UC55 | UC56 |
| UC57 | UC58 | UC59 | UC60 | UC61 | UC62 | UC63 | UC64 |

| UC1 | UC2 | UC3 | UC4 | UC5 | UC6 | UC7 | UC8 |
|-----|-----|-----|-----|-----|-----|-----|-----|
| UC9 | UC10 | UC11 | UC12 | UC13 | UC14 | UC15 | UC16 |
| UC17 | UC18 | UC19 | UC20 | UC21 | UC22 | UC23 | UC24 |
| UC25 | UC26 | UC27 | UC28 | UC29 | UC30 | UC31 | UC32 |
| UC33 | UC34 | UC35 | UC36 | UC37 | UC38 | UC39 | UC40 |
| UC41 | UC42 | UC43 | UC44 | UC45 | UC46 | UC47 | UC48 |
| UC49 | UC50 | UC51 | UC52 | UC53 | UC54 | UC55 | UC56 |
| UC57 | UC58 | UC59 | UC60 | UC61 | UC62 | UC63 | UC64 |

| UC1 | UC2 | UC3 | UC4 | UC5 | UC6 | UC7 | UC8 |
|---|---|---|---|---|---|---|---|
| UC9 | UC10 | UC11 | UC12 | UC13 | UC14 | UC15 | UC16 |
| UC17 | UC18 | UC19 | UC20 | UC21 | UC22 | UC23 | UC24 |
| UC25 | UC26 | UC27 | UC28 | UC29 | UC30 | UC31 | UC32 |
| UC33 | UC34 | UC35 | UC36 | UC37 | UC38 | UC39 | UC40 |
| UC41 | UC42 | UC43 | UC44 | UC45 | UC46 | UC47 | UC48 |
| UC49 | UC50 | UC51 | UC52 | UC53 | UC54 | UC55 | UC56 |
| UC57 | UC58 | UC59 | UC60 | UC61 | UC62 | UC63 | UC64 |

| UC1 | UC2 | UC3 | UC4 | UC5 | UC6 | UC7 | UC8 |
|---|---|---|---|---|---|---|---|
| UC9 | UC10 | UC11 | UC12 | UC13 | UC14 | UC15 | UC16 |
| UC17 | UC18 | UC19 | UC20 | UC21 | UC22 | UC23 | UC24 |
| UC25 | UC26 | UC27 | UC28 | UC29 | UC30 | UC31 | UC32 |
| UC33 | UC34 | UC35 | UC36 | UC37 | UC38 | UC39 | UC40 |
| UC41 | UC42 | UC43 | UC44 | UC45 | UC46 | UC47 | UC48 |
| UC49 | UC50 | UC51 | UC52 | UC53 | UC54 | UC55 | UC56 |
| UC57 | UC58 | UC59 | UC60 | UC61 | UC62 | UC63 | UC64 |

| UC1 | UC2 | UC3 | UC4 | UC5 | UC6 | UC7 | UC8 |
|---|---|---|---|---|---|---|---|
| UC9 | UC10 | UC11 | UC12 | UC13 | UC14 | UC15 | UC16 |
| UC17 | UC18 | UC19 | UC20 | UC21 | UC22 | UC23 | UC24 |
| UC25 | UC26 | UC27 | UC28 | UC29 | UC30 | UC31 | UC32 |
| UC33 | UC34 | UC35 | UC36 | UC37 | UC38 | UC39 | UC40 |
| UC41 | UC42 | UC43 | UC44 | UC45 | UC46 | UC47 | UC48 |
| UC49 | UC50 | UC51 | UC52 | UC53 | UC54 | UC55 | UC56 |
| UC57 | UC58 | UC59 | UC60 | UC61 | UC62 | UC63 | UC64 |

| UCA | UCB | UCC | UCD |
| UCE | UCF | UCG | UCH |
| UCI | UCJ | UCK | UCL |
| UCM | UCN | UCO | UCP |

DIGITAL-TO-ANALOG CONVERTER AND ELECTRONIC SYSTEM INCLUDING THE SAME

CROSS-REFERENCE TO RELATED APPLICATION

This application claims priority under 35 USC § 119 to Korean Patent Application No. 10-2019-0143138, filed on Nov. 11, 2019 in the Korean Intellectual Property Office (KIPO), the contents of which are herein incorporated by reference in their entirety.

BACKGROUND

1. Technical Field

Example embodiments relate generally to semiconductor integrated circuits, and more particularly to digital-to-analog converters and electronic systems including the digital-to-analog converters.

2. Description of the Related Art

Real-world analog signals are routinely converted to a digital representation that may be easily processed in modern digital systems. In many systems, this digital information is converted back to an analog form to perform some real-world function. The circuits that perform this conversion are digital-to-analog converters (DACs), and their outputs are used to drive a variety of devices. Such devices include, but are not limited to, loudspeakers, video displays, motors, mechanical servos, radio frequency (RF) transmitters, and temperature controls. DACs are often incorporated into digital systems in which real-world analog signals are digitized by analog-to-digital converters (ADCs), processed, and then converted back to analog form by the DACs. Typically, DACs include a current array that includes a plurality of unit cells and is responsible for the output, and various studies have been performed to improve mismatch between unit cells.

SUMMARY

At least one example embodiment of the present disclosure provides a digital-to-analog converter (DAC) driven by a dynamic element matching (DEM) capable of reducing hardware (e.g., hardware size, hardware amount, etc.) while operating with high resolution and/or high speed.

At least one example embodiment of the present disclosure provides an electronic system including the digital-to-analog converter.

According to example embodiments, a digital-to-analog converter (DAC) includes a current array including a plurality of unit cells, the plurality of unit cells being arranged in a matrix formation including a plurality of rows and a plurality of columns, an arbitrary switch box configured to change an arrangement order of bits based on a random number, and processing circuitry configured to generate $(2^M+1)$ first bits based on an upper M bits of a digital input signal of N bits, N being an integer greater than or equal to two and M being an integer less than N, generate a plurality of first row selection signals and a plurality of second row selection signals based on a plurality of randomized first bits, the plurality of randomized first bits being obtained from the arbitrary switch box based on the $(2^M+1)$ first bits, generate $2^{(N-M)}$ column selection signals based on a lower (N–M) bits of the digital input signal, randomly select a subset of rows among the plurality of rows based on the plurality of first row selection signals, the subset of rows including first unit cells among the plurality of unit cells, randomly select one row among the plurality of rows based on the plurality of second row selection signals, select a subset of columns among the plurality of columns based on the $2^{(N-M)}$ column selection signals, second unit cells among the plurality of unit cells being included in both the one row and the subset of columns, and generate an analog output signal corresponding to the digital input signal based on the first unit cells and the second unit cells.

According to example embodiments, a digital-to-analog converter (DAC) includes a current array including a plurality of unit cells, the plurality of unit cells being arranged in a matrix formation including a plurality of rows and a plurality of columns, an arbitrary switch box configured to change an arrangement order of bits based on a random number, and processing circuitry configured to generate $(2^M+1)$ first bits based on an upper M bits of a digital input signal of N bits, N being an integer greater than or equal to two and M being an integer less than N, generate a plurality of first column selection signals and a plurality of second column selection signals based on a plurality of randomized first bits, the plurality of randomized first bits being obtained from the arbitrary switch box based on the $(2^M+1)$ first bits, generate $2^{(N-M)}$ row selection signals based on a lower (N–M) bits of the digital input signal, randomly select a subset of columns among the plurality of columns based on the plurality of first column selection signals, the subset of columns including first unit cells among the plurality of unit cells, randomly select one column among the plurality of columns based on the plurality of second column selection signals, select a subset of rows among the plurality of rows based on the $2^{(N-M)}$ row selection signals, second unit cells among the plurality of unit cells being included in both the one column and the subset of rows, and generate an analog output signal corresponding to the digital input signal based on the first unit cells and the second unit cells.

According to example embodiments, an electronic system includes a first digital-to-analog converter (DAC) configured to generate a first analog output signal based on a first digital input signal, wherein the first digital-to-analog converter includes a current array including a plurality of unit cells, the plurality of unit cells being in a matrix formation including a plurality of rows and a plurality of columns, an arbitrary switch box configured to change an arrangement order of bits based on a random number, and processing circuitry configured to generate $(2^M+1)$ first bits based on an upper M bits among the first digital input signal of N bits, N being an integer greater than or equal to two and M being an integer less than N, generate a plurality of first row selection signals and a plurality of second row selection signals based on a plurality of randomized first bits, the plurality of randomized first bits being obtained from the arbitrary switch box based on $(2^M+1)$ first bits, generate $2^{(N-M)}$ column selection signals based on a lower (N–M) bits of the first digital input signal, randomly select a subset of rows among the plurality of rows based on the plurality of first row selection signals, the subset of rows including first unit cells among the plurality of unit cells, randomly select one row among the plurality of rows based on the plurality of second row selection signals, select a subset of columns among the plurality of columns based on the $2^{(N-M)}$ column selection signals, second unit cells among the plurality of unit cells being included in both the one row and the subset of columns, and generate the first analog output signal based on the first unit cells and the second unit cells.

The digital-to-analog converter and the electronic system according to example embodiments may include the current array in which the plurality of unit cells are two-dimensionally arranged, may select some rows (or columns) of the current array based on the upper bits of the digital input signal, may select some columns (or rows) of the current array based on the lower bits of the digital input signal, and may be implemented with a row-only (or column-only) dynamic element matching in which the dynamic element matching is applied only when randomly selecting the rows (or columns) based on the upper bits and the dynamic element matching is not applied when selecting the columns (or rows) based on the lower bits. In this example, the lower bits may be automatically randomized even if only the upper bits are randomized. Accordingly, as compared with a conventional row-column dynamic element matching in which all bits of the digital input signal are randomized, the size of hardware may be reduced while having nearly the same performance, thereby operating with high speed, high resolution and/or low power.

BRIEF DESCRIPTION OF THE DRAWINGS

Illustrative, non-limiting example embodiments will be more clearly understood from the following detailed description taken in conjunction with the accompanying drawings.

FIGS. 3, 4A, 4B, 4C, 4D, 4E, 4F, 4G and 4H are diagrams for describing an operation of a digital-to-analog converter of FIG. 2.

FIGS. 8, 9A, 9B, 9C and 9D are diagrams for describing an operation of a digital-to-analog converter of FIG. 7.

DETAILED DESCRIPTION

Figure 1:
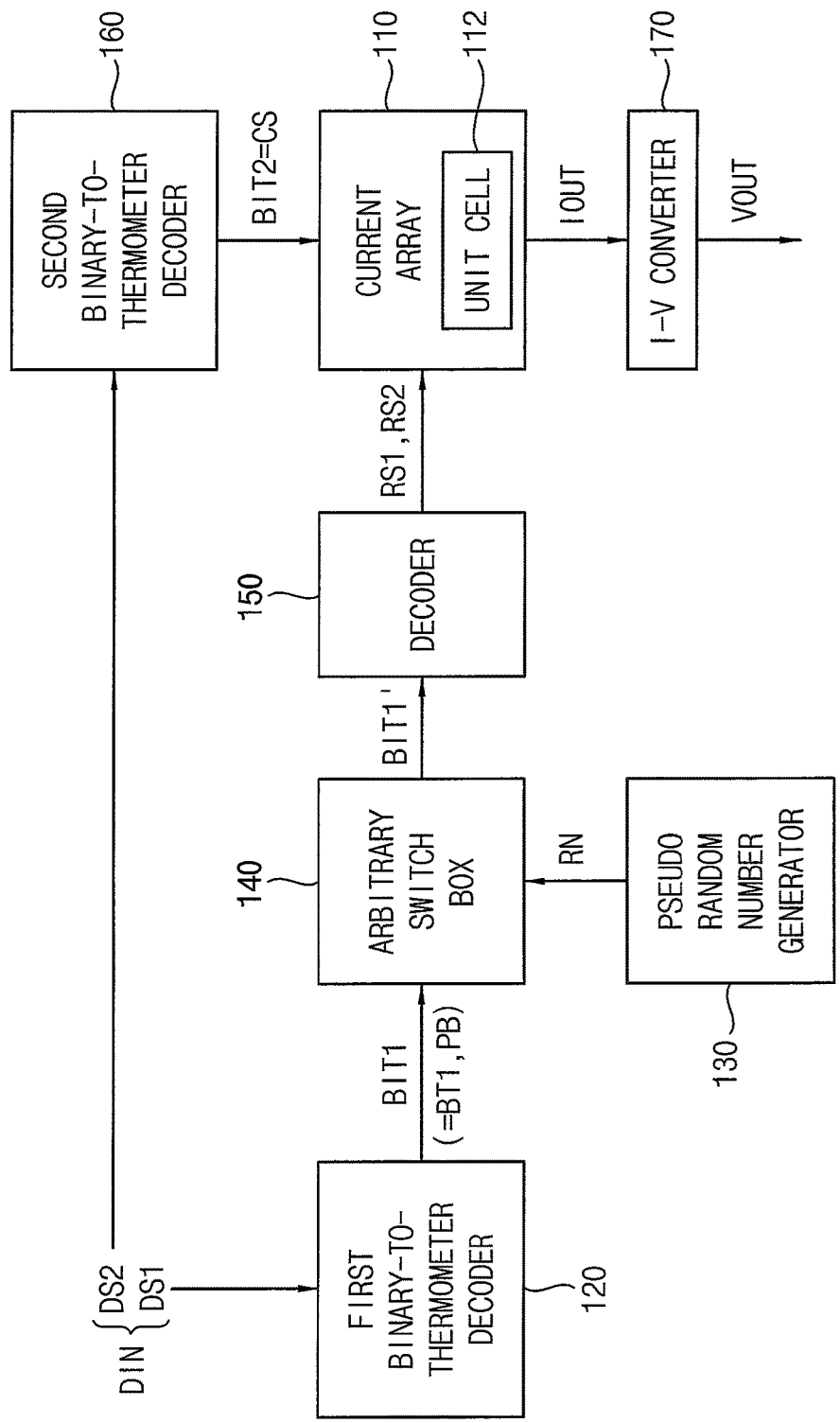
FIG. 1 is a block diagram illustrating a digital-to-analog converter (DAC) for applying dynamic element matching to selection of rows of a current array according to example embodiments.

Various example embodiments will be described more fully with reference to the accompanying drawings, in which embodiments are shown. The present disclosure may, however, be embodied in many different forms and should not be construed as limited to some example embodiments set forth herein. Like reference numerals refer to like elements throughout this application.

FIG. 1 is a block diagram illustrating a digital-to-analog converter (DAC) according to example embodiments.

Referring to FIG. 1, a digital-to-analog converter (DAC) 100 includes a current array 110, a first binary-to-thermometer decoder 120, a pseudo random number generator 130, an arbitrary switch box 140 (may also be referred to herein as a switch box), a decoder 150 (may also be referred to as a row decoder herein) and/or a second binary-to-thermometer decoder 160. The digital-to-analog converter 100 may further include a current-to-voltage (I-V) converter 170. According to some example embodiments, operations described herein as being performed by the digital-to-analog converter 100, the first binary-to-thermometer decoder 120, the pseudo random number generator 130, the arbitrary switch box 140, the decoder 150, the second binary-to-thermometer decoder 160 and/or the current-to-voltage (I-V) converter 170 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The current array 110 includes a plurality of unit cells 112 that are arranged in a matrix formation including a plurality of rows and a plurality of columns. The current array 110 is a circuit responsible for an output of the digital-to-analog converter 100. For example, the current array 110 may generate a current signal IOUT corresponding to an analog output signal VOUT, which is the output of the digital-to-analog converter 100.

The first binary-to-thermometer decoder 120 may generate ($2^M$+1) first bits BIT1 based on a first digital signal DS1 corresponding to upper M bits among a digital input signal DIN of N bits, where N is an integer greater than or equal to two and M is an integer less than N. According to some example embodiments, the first binary-to-thermometer decoder 120 may generate the ($2^M$+1) first bits BIT1 based on the upper M bits among a digital input signal DIN. According to some example embodiments, the first digital signal DS1 may be the same as or similar to the upper M bits of the digital input signal DIN.

The ($2^M$+1) first bits BIT1 generated by the first binary-to-thermometer decoder 120 may be categorized into (or separated from) $2^M$ bits BT1 and one bit PB other than the $2^M$ bits BT1. The $2^M$ bits BT1 among the ($2^M$+1) first bits BIT1 may be bits corresponding to a value of the first digital signal DS1. For example, the number (e.g., quantity) of bits having a first bit value (e.g., "1") among the $2^M$ bits BT1 may be equal or substantially equal to the value of the first digital signal DS1. The one bit PB other than the $2^M$ bits BT1 among the ($2^M$+1) first bits BIT1 may be a pointer bit for a dynamic element matching (DEM). For example, the pointer bit may always have the first bit value.

The pseudo random number generator 130 may generate at least one random number RN. For example, the number (e.g., quantity) of the random numbers RN generated by the pseudo random number generator 130 may be equal or substantially equal to M.

The arbitrary switch box 140 may change an arrangement order of the first bits BIT1 based on the random number RN, and output the first bits BIT1' of which the arrangement order is changed. For example, the arbitrary switch box 140 may include at least one stage, and may include a plurality of switches. According to some example embodiments, the arbitrary switch box 140 may randomly change an arrangement order of the first bits BIT1 based on the random number RN, and output the first bits BIT1' of which the arrangement order is changed. According to some example embodiments, the number (e.g., quantity) of the at least one stage is equal or substantially equal to M.

The decoder 150 may generate a plurality of first row selection signals RS1 and a plurality of second row selection signals RS2 based on the first bits BIT1' of which the arrangement order is changed (the first bits BIT1' may also be referred to herein as a plurality of randomized first bits). According to some example embodiments, the decoder 150 may obtain the first bits BIT1' from the arbitrary switch box 140. The plurality of first row selection signals RS1 and the plurality of second row selection signals RS2 may be signals for selecting some of the plurality of rows included in the current array 110. For example, the number (e.g., quantity) of the plurality of first row selection signals RS1 and the number (e.g., quantity) of the plurality of second row selection signals RS2 may be equal or substantially equal to the number of the plurality of rows, respectively. According to some example embodiments, the decoder 150 may generate the second row selection signals RS2 based on the pointer bit.

The second binary-to-thermometer decoder 160 may generate $2^{(N-M)}$ second bits BIT2 and/or a plurality of column selection signals CS based on a second digital signal DS2 corresponding to lower (N−M) bits other than the upper M bits among the digital input signal DIN of N bits. The plurality of column selection signals CS may correspond to the $2^{(N-M)}$ second bits BIT2. The plurality of column selection signals CS may be signals for selecting some of the plurality of columns included in the current array 110. For example, the number (e.g., quantity) of the plurality of column selection signals CS may be equal or substantially equal to the number (e.g., quantity) of the plurality of columns. According to some example embodiments, the second bits BIT2 and the plurality of column selection signals CS may be the same or substantially the same as each other. According to some example embodiments, the second binary-to-thermometer decoder 160 may generate $2^{(N-M)}$ column selection signals CS based on the lower (N−M) bits of the digital input signal DIN. According to some example embodiments, the second binary-to-thermometer decoder 160 may generate $2^{(N-M)}$ column selection signals CS based on the lower (N−M) bits of the digital input signal DIN without randomizing the lower (N−M) bits of the digital input signal DIN and/or without providing the lower (N−M) bits of the digital input signal DIN to the arbitrary switch box 140. According to some example embodiments, the second digital signal DS2 may be the same as or similar to the lower (N−M) bits of the digital input signal DIN.

The $2^{(N-M)}$ second bits BIT2 generated by the second binary-to-thermometer decoder 160 may be bits corresponding to a value of the second digital signal DS2. For example, the number of bits having the first bit value (e.g., "1") among the $2^{(N-M)}$ second bits BIT2 may be equal or substantially equal to the value of the second digital signal DS2.

In the digital-to-analog converter 100 according to example embodiments, X rows (may also be referred to herein as a subset of rows) among the plurality of rows included in the current array 110 may be randomly selected based on the plurality of first row selection signals RS1, where X is zero or a positive integer, and thus unit cells included in the X rows among the plurality of unit cells 112 may be selected. In other words, all the unit cells included in the X rows (may also be referred to herein as first unit cells) may be selected based on the plurality of first row selection signals RS1. In this example, the dynamic element matching may be applied or employed in selecting the X rows. According to some example embodiments, the decoder 150 may randomly select the X rows by generating the first row selection signals RS1.

Further, in the digital-to-analog converter 100 according to example embodiments, one row among the plurality of rows included in the current array 110 may be randomly selected based on the plurality of second row selection signals RS2, Y columns (may also be referred to herein as a subset of columns) included in the one row among the plurality of columns included in the current array 110 may be selected based on the plurality of column selection signals CS, where Y may be zero or a positive integer, and thus unit cells included in the one row and the Y columns among the plurality of unit cells 112 may be selected. In other words, all the unit cells included in the one row and the Y columns (may also be referred to herein as second unit cells) may be selected based on the plurality of second row selection signals RS2 and the plurality of column selection signals CS. In this example, the dynamic element matching may not be applied or employed in selecting the Y columns. According to some example embodiments, the decoder 150 may randomly select the one row by generating the second row selection signals RS2. According to some example embodiments, the second binary-to-thermometer decoder 160 may select the Y columns by generating the plurality of column selection signals CS.

In some example embodiments, the X rows selected based on the plurality of first row selection signals RS1 may be consecutive rows. However, example embodiments are not limited thereto, and the X rows may not be consecutive rows. The one row selected based on the plurality of second row selection signals RS2 may be a row arranged subsequent to the last row among the X rows.

In some example embodiments, a randomization for randomly selecting the X rows may be performed by changing the arrangement order of the first bits BIT1 by the arbitrary switch box 140 (e.g., based on a randomization provided by the plurality of randomized first bits), and thus the dynamic element matching may be applied in selecting the X rows. Since the one row selected based on the plurality of second row selection signals RS2 is the row arranged subsequent to the last row among the X rows, the one row may also be randomly selected as the X rows are randomly selected, even if no additional randomization is performed. According to some example embodiments, the one row may be randomly selected based on the randomization for randomly selecting the X rows without performing additional randomization.

In some example embodiments, the Y columns selected based on the plurality of column selection signals CS and included in the one row selected based on the plurality of second row selection signals RS2 may be consecutive columns. However, example embodiments are not limited thereto, and the Y columns may not be consecutive columns.

In some example embodiments, the Y columns may be a first column through a Y-th column among columns included in the one row. In other words, the dynamic element matching may not be applied in selecting the Y columns. However, since the one row is randomly selected as described above, an effect and/or result of randomly selecting the Y columns may be obtained even if the dynamic element matching is not applied, which will be described with reference to FIGS. 4A through 4H.

The analog output signal VOUT corresponding to the digital input signal DIN may be generated based on the selected unit cells (e.g., the unit cells selected based on the plurality of first row selection signals RS1, the plurality of second row selection signals RS2 and the plurality of column selection signals CS). For example, the current array 110 may generate the current signal IOUT based on the selected unit cells (e.g., the first unit cells and the second unit cells), and the current-to-voltage converter 170 may generate the analog output signal VOUT, which is a voltage signal, based on the current signal IOUT.

Typically, a digital-to-analog converter includes a current array including a plurality of unit cells and responsible for an output. It is desired that each unit cell have the same output value or a similar output value, however, a mismatch error may occur between unit cells due to a manufacturing process, and thus a linearity of the output may be degraded. To improve the linearity of the output, a method of randomizing the mismatch error between unit cells based on a dynamic element matching method has been used. The dynamic element matching represents a scheme of randomly selecting unit cells based on an input, generating the output, and then converting a linearity error into a random noise. In a general dynamic element matching, all bits of a binary digital input are randomized, and thus the hardware grows exponentially as the binary digital input increases by one bit (e.g., the size and complexity of the arbitrary switch box increases by the power of two). As a result, it is difficult to implement with high speed due to an increase in a load, and/or power consumption is also increased.

The digital-to-analog converter 100 according to example embodiments may include the current array 110 in which the plurality of unit cells 112 are two-dimensionally arranged, may select some rows of the current array 110 based on the first digital signal DS1 corresponding to the upper bits of the digital input signal DIN, may select some columns of the current array 110 based on the second digital signal DS2 corresponding to the lower bits of the digital input signal DIN, and may be implemented with a row-only dynamic element matching in which the dynamic element matching is applied only when randomly selecting the rows based on the upper bits without applying the dynamic element matching when selecting the columns based on the lower bits. In this example, the lower bits may be automatically randomized even if only the upper bits are randomized. Accordingly, as compared with a conventional row-column dynamic element matching in which all bits of the digital input signal are randomized, the size of hardware (particularly, the size of the arbitrary switch box 140) may be reduced while having nearly the same performance, thereby operating with high speed, high resolution and/or low power.

Figure 2:
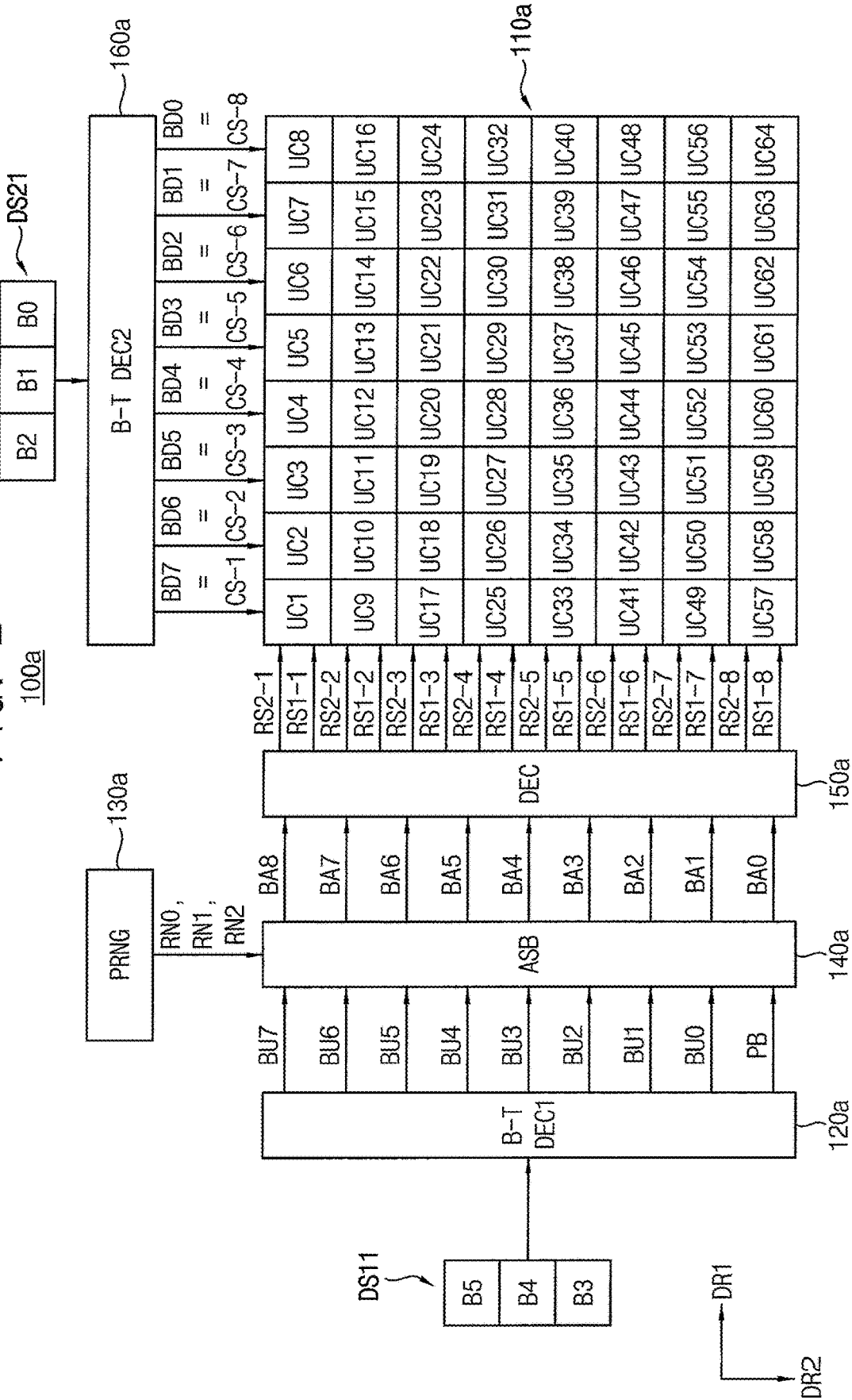
FIG. 2 is a block diagram illustrating an example of a digital-to-analog converter of FIG. 1.

FIG. 2 is a block diagram illustrating an example of a digital-to-analog converter of FIG. 1.

Referring to FIG. 2, a digital-to-analog converter 100a includes a current array 110a, a first binary-to-thermometer decoder (B-T DEC1) 120a, a pseudo random number generator (PRNG) 130a, an arbitrary switch box (ASB) 140a, a decoder (DEC) 150a and/or a second binary-to-thermometer decoder (B-T DEC2) 160a. FIG. 2 illustrates an example of randomizing only the upper 3 bits among a digital input signal of 6 bits, e.g., an example where N=6 and M=3 in FIG. 1. For convenience of illustration, a configuration corresponding to the current-to-voltage converter 170 in FIG. 1 is omitted in FIG. 2. According to some example embodiments, operations described herein as being performed by the digital-to-analog converter 100a, the first binary-to-thermometer decoder 120a, the pseudo random number generator 130a, the decoder 150a and/or the second binary-to-thermometer decoder 160a may be performed by processing circuitry.

The digital input signal of 6 bits may be separated from or divided into a first digital signal DS11 corresponding to the upper 3 bits and a second digital signal DS21 corresponding to lower 3 bits. A bit B5 among bits B3, B4 and B5 of the first digital signal DS11 may represent a most significant bit (MSB) of the digital input signal, and a bit B0 among bits B0, B1 and B2 of the second digital signal DS21 may represent a least significant bit (LSB) of the digital input signal.

The current array 110a may include a plurality of unit cells UC1, UC2, UC3, UC4, UC5, UC6, UC7, UC8, UC9, UC10, UC11, UC12, UC13, UC14, UC15, UC16, UC17, UC18, UC19, UC20, UC21, UC22, UC23, UC24, UC25, UC26, UC27, UC28, UC29, UC30, UC31, UC32, UC33, UC34, UC35, UC36, UC37, UC38, UC39, UC40, UC41, UC42, UC43, UC44, UC45, UC46, UC47, UC48, UC49, UC50, UC51, UC52, UC53, UC54, UC55, UC56, UC57, UC58, UC59, UC60, UC61, UC62, UC63 and UC64 that are arranged along a first direction DR1 and a second direction DR2.

The number of rows and the number of columns included in the current array 110a may correspond to the number of bits of the first digital signal DS11 and the number of bits of the second digital signal DS21, respectively. For example, the first digital signal DS11 for row selection may include three bits B3 to B5, and thus the current array 110a may include $2^3$=8 rows. Similarly, the second digital signal DS21 for column selection may include three bits B0 to B2, and thus the current array 110a may include $2^3$=8 columns.

The first binary-to-thermometer decoder 120a may generate first bits PB, BU0, BU1, BU2, BU3, BU4, BU5, BU6 and BU7 based on the bits B3 to B5 of the first digital signal DS11. For example, the first digital signal DS11 may include three bits B3 to B5, and thus the first binary-to-thermometer decoder 120a may generate $(2^3+1)$=9 bits PB and BU0 to BU7. For example, the bit PB may be the pointer bit, and the bits BU0 to BU7 may be bits corresponding to a value of the first digital signal DS11.

The pseudo random number generator 130a may generate random numbers RN0, RN1 and RN2. According to some example embodiments, the pseudo random number generator 130a may generate a quantity of random numbers equal or similar to the quantity of bits included in the first digital signal DS11. For example, the first digital signal DS11 may include three bits B3 to B5, and thus the pseudo random number generator 130a may generate three random numbers RN0 to RN2.

The arbitrary switch box 140a may change an arrangement order of the first bits PB and BU0 to BU7 output from the first binary-to-thermometer decoder 120a based on the random numbers RN0 to RN2, and may output bits (e.g., the arrangement-changed bits) BA0, BA1, BA2, BA3, BA4, BA5, BA6, BA7 and BA8. For example, the arbitrary switch box 140a may just change the arrangement order of the bits PB and BU0 to BU7 and may not change values of the bits PB and BU0 to BU7, and thus each of the bits BA0 to BA8 output from the arbitrary switch box 140a may be substantially the same as a respective one of the first bits PB and BU0 to BU7 output from the first binary-to-thermometer decoder 120a.

The decoder 150a may generate a plurality of first row selection signals RS1-1, RS1-2, RS1-3, RS1-4, RS1-5, RS1-6, RS1-7 and RS1-8 and a plurality of second row selection signals RS2-1, RS2-2, RS2-3, RS2-4, RS2-5, RS2-6, RS2-7 and RS2-8 based on the bits BA0 to BA8. For example, the current array 110a may include eight rows, and thus the plurality of first row selection signals RS1-1 to RS1-8 and the plurality of second row selection signals RS2-1 to RS2-8 may include eight signals, respectively. One of the plurality of first row selection signals RS1-1 to RS1-8 and one of the plurality of second row selection signals RS2-1 to RS2-8 may be used to select a respective one of the plurality of rows included in the current array 110a. For example, the first row selection signal RS1-1 and the second row selection signal RS2-1 may be used to select a first row of the current array 110a.

The second binary-to-thermometer decoder 160a may generate second bits BD0, BD1, BD2, BD3, BD4, BD5, BD6 and BD7 and a plurality of column selection signals CS-1, CS-2, CS-3, CS-4, CS-5, CS-6, CS-7 and CS-8 that correspond to (e.g., substantially the same as) the second bits BD0 to BD7 based on the bits B0 to B2 of the second digital signal DS21. For example, the second digital signal DS21 may include three bits B0 to B2, and thus the second binary-to-thermometer decoder 160a may generate $2^3$=8 bits BD0 to BD7 and 8 column selection signals CS-1 to CS-8. For example, the second bits BD0 to BD7 may be bits corresponding to a value of the second digital signal DS21.

FIGS. 3, 4A, 4B, 4C, 4D, 4E, 4F, 4G and 4H are diagrams for describing an operation of a digital-to-analog converter of FIG. 2.

Figure 3:
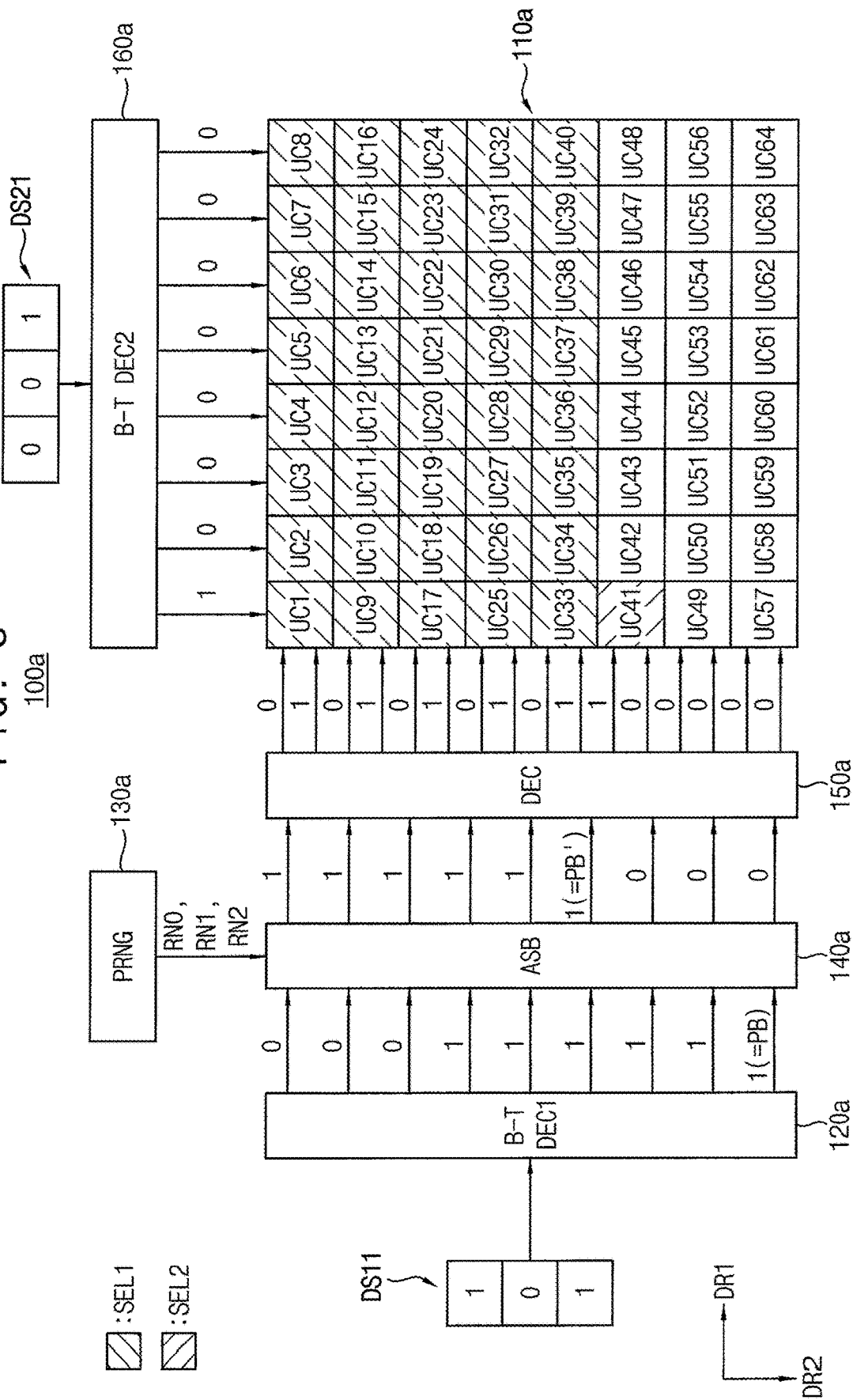

Referring to FIG. 3, when the digital input signal of 6 bits is provided as "101001," the bits B3 to B5 of the first digital signal DS11 may have a value of "101" corresponding to the upper 3 bits, and the bits B0 to B2 of the second digital signal DS21 may have a value of "001" corresponding to the lower 3 bits.

The first binary-to-thermometer decoder 120a may convert the value of "101" corresponding to the upper 3 bits into "00011111," and may output "000111111" by adding "1" to the least significant bit. In other words, among the first bits PB and BU0 to BU7 output from the first binary-to-thermometer decoder 120a, the bits BU0 to BU7 may have a value of "00011111," and the bit PB may have a value of "1."

The value "00011111," which is the value of the bits BU0 to BU7 output from the first binary-to-thermometer decoder 120a, may be generated based on the first digital signal DS11. For example, the value of the first digital signal DS11 may be "101," which is expressed as decimal "5," and thus the value of the bits BU0 to BU7 may be set or determined to include five "1s." For example, the lower bits BU0 to BU4 among the bits BU0 to BU7 may have a value of "1."

The value of the bit PB output from the first binary-to-thermometer decoder 120a may always be fixed to "1." A role or function of the bit PB may be a pointer for operating a row dynamic element matching even if the value of the upper 3 bits is "000." For example, when it is assumed that the bit PB is not used, and when the digital input signal of 6 bits is provided as "000001," the value of the upper 3 bits may be "000," and thus the output of the first binary-to-thermometer decoder 120a may be "00000000." In this example, the output of the arbitrary switch box 140a may always be "00000000," and thus one row for a column value or column selection may not be selected (e.g., the one row selected by the plurality of second row selection signals RS2-1 to RS2-8). In contrast, when the bit PB is used as illustrated in FIG. 3, the output of the first binary-to-thermometer decoder 120a may be "000000001" even if the value of the upper 3 bits is "000." In this example, the output of the arbitrary switch box 140a may be changed to one of "000000001," "000000010," "000000100," "000001000," "000010000," "000100000," "001000000," "010000000" and/or "100000000," and thus the one row for the column value may be selected based on the output of the arbitrary switch box 140a.

The arbitrary switch box 140a may change an arrangement order of "000111111" output from the first binary-to-thermometer decoder 120a based on the random numbers RN0 to RN2 to output "111111000." In this example, the bit BA3 among the bits BA0 to BA8 output from the arbitrary switch box 140a may correspond to the bit PB output from the first binary-to-thermometer decoder 120a, and thus the bit BA3 may be denoted as PB'.

However, example embodiments are not limited thereto, and the output of the arbitrary switch box 140a may be changed to, e.g., one of "111111000," "011111100," "001111110," "000111111," "100011111," "110001111," "111000111" and/or "111100011" as the dynamic element matching is applied.

The decoder 150a may set values of the first row selection signals RS1-1 to RS1-5 among the plurality of first row selection signals RS1-1 to RS1-8 to "1," may set values of the first row selection signals RS1-6 to RS1-8 among the plurality of first row selection signals RS1-1 to RS1-8 to "0," may set a value of the second row selection signal RS2-6 among the plurality of second row selection signals RS2-1 to RS2-8 to "1," and may set values of the second row selection signals RS2-1 to RS2-5 and RS2-7 to RS2-8 among the plurality of second row selection signals RS2-1 to RS2-8 to "0," based on the value of "111111000" output from the arbitrary switch box 140a. Particularly, the bits PB and PB' each of which is the pointer bit may be used to set the value of the second row selection signal RS2-6 to "1."

The second binary-to-thermometer decoder 160a may convert the value of "001" corresponding to the lower 3 bits into "10000000," and may output "10000000." The value "10000000," which is the value of the bits BD0 to BD7 and the plurality of column selection signals CS-1 to CS-8 output from the second binary-to-thermometer decoder 160a, may be generated based on the second digital signal DS21. For example, the value of the second digital signal DS21 may be "001," which is expressed as decimal "1," and thus the value of the bits BD0 to BD7 may be set or determined to include one "1." For example, the upper bit BD7 among the bits BD0 to BD7 may have a value of "1."

First to fifth rows of the current array 110a and the unit cells UC1 to UC40 included therein may be selected based on the first row selection signals RS1-1 to RS1-5 having a value of "1." Since the row dynamic element matching is applied, the first to fifth rows and the unit cells UC1 to UC40 included therein may be randomly selected. The unit cells UC1 to UC40 selected based on the first row selection signals RS1-1 to RS1-5 are hatched and denoted as "SELL."

A sixth row of the current array 110a may be selected based on the second row selection signal RS2-6 having a value of "1," a first column of the current array 110a may be selected based on the column selection signal CS-1 having a value of "1," and thus the unit cell UC41 included in the sixth row and the first column may be selected. Since a column dynamic element matching is not applied, the first column may always be selected. However, the sixth row may be randomly selected as the row dynamic element matching is applied, and thus the unit cell UC41 may be randomly selected although the column dynamic element matching is not applied. The unit cell UC41 selected based on the second row selection signal RS2-6 and the column selection signal CS-1 is hatched different from the unit cells UC1 to UC40 and denoted as "SEL2."

The current signal IOUT and the analog output signal VOUT corresponding thereto may be generated based on the selected unit cells UC1 to UC41.

Hereinafter, an operation in which unit cells are randomly selected even if only the row dynamic element matching is applied and the column dynamic element matching is not applied will be described with reference to FIGS. 4A through 4H.

Referring to FIG. 4A, when the value of "111111000" is output from the arbitrary switch box 140a as described with reference to FIG. 3, the unit cells UC1 to UC40 of the current array 110a may be selected based on the first row selection signals RS1-1 to RS1-5, and the unit cell UC41 of the current array 110a may be selected based on the second row selection signal RS2-6 and the column selection signal CS-1.

Referring to FIG. 4B, when a value of "011111100" is output from the arbitrary switch box 140a, the unit cells UC9 to UC48 of the current array 110a may be selected based on the first row selection signals RS1-2 to RS1-6, and the unit cell UC49 of the current array 110a may be selected based on the second row selection signal RS2-7 and the column selection signal CS-1.

Referring to FIG. 4C, when a value of "001111110" is output from the arbitrary switch box 140a, the unit cells UC17 to UC56 of the current array 110a may be selected based on the first row selection signals RS1-3 to RS1-7, and the unit cell UC57 of the current array 110a may be selected based on the second row selection signal RS2-8 and the column selection signal CS-1.

Referring to FIG. 4D, when a value of "001111110" is output from the arbitrary switch box 140a, the unit cells UC25 to UC64 of the current array 110a may be selected based on the first row selection signals RS1-4 to RS1-8, and the unit cell UC1 of the current array 110a may be selected based on the second row selection signal RS2-1 and the column selection signal CS-1.

Referring to FIG. 4E, when a value of "110001111" is output from the arbitrary switch box 140a, the unit cells UC1 to UC8 and UC33 to UC64 of the current array 110a may be selected based on the first row selection signals RS1-1 and RS1-5 to RS1-8, and the unit cell UC9 of the current array 110a may be selected based on the second row selection signal RS2-2 and the column selection signal CS-1.

Referring to FIG. 4F, when a value of "111000111" is output from the arbitrary switch box 140a, the unit cells UC1 to UC16 and UC41 to UC64 of the current array 110a may be selected based on the first row selection signals RS1-1, RS1-2 and RS1-6 to RS1-8, and the unit cell UC17 of the current array 110a may be selected based on the second row selection signal RS2-3 and the column selection signal CS-1.

Referring to FIG. 4G, when a value of "111100011" is output from the arbitrary switch box 140a, the unit cells UC1 to UC24 and UC49 to UC64 of the current array 110a may be selected based on the first row selection signals RS1-1 to RS1-3, RS1-7 and RS1-8, and the unit cell UC25 of the current array 110a may be selected based on the second row selection signal RS2-4 and the column selection signal CS-1.

Referring to FIG. 4H, when a value of "111110001" is output from the arbitrary switch box 140a, the unit cells UC1 to UC32 and UC57 to UC64 of the current array 110a may be selected based on the first row selection signals RS1-1 to RS1-4 and RS1-8, and the unit cell UC33 of the current array 110a may be selected based on the second row selection signal RS2-5 and the column selection signal CS-1.

As described above, row data may be randomized as the row dynamic element matching is applied, and one of eight cases illustrated in FIGS. 4A through 4H may be randomly selected based on the randomized row data. Column data may not be randomized as the column dynamic element matching is not applied, and the leftmost unit cell may always be selected (in this example). However, since the one row selected to represent the column data is changed as the row data is randomized, the column data may be randomized into eight cases similarly to the row data even without additional column dynamic element matching.

Figure 5A:
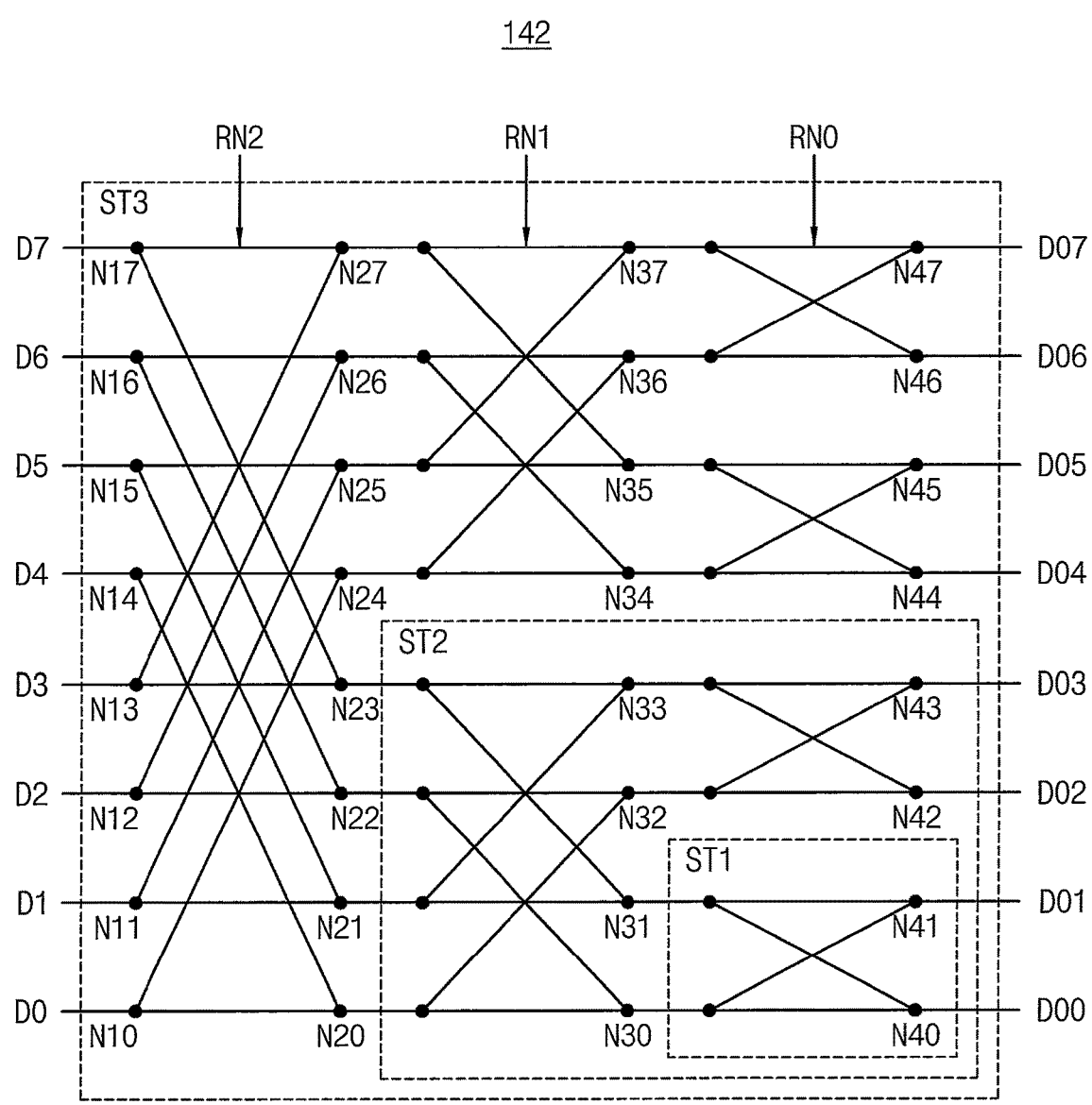
FIGS. 5A and 5B are diagrams illustrating an example of an arbitrary switch box included in a digital-to-analog converter according to example embodiments.
Figure 5B:
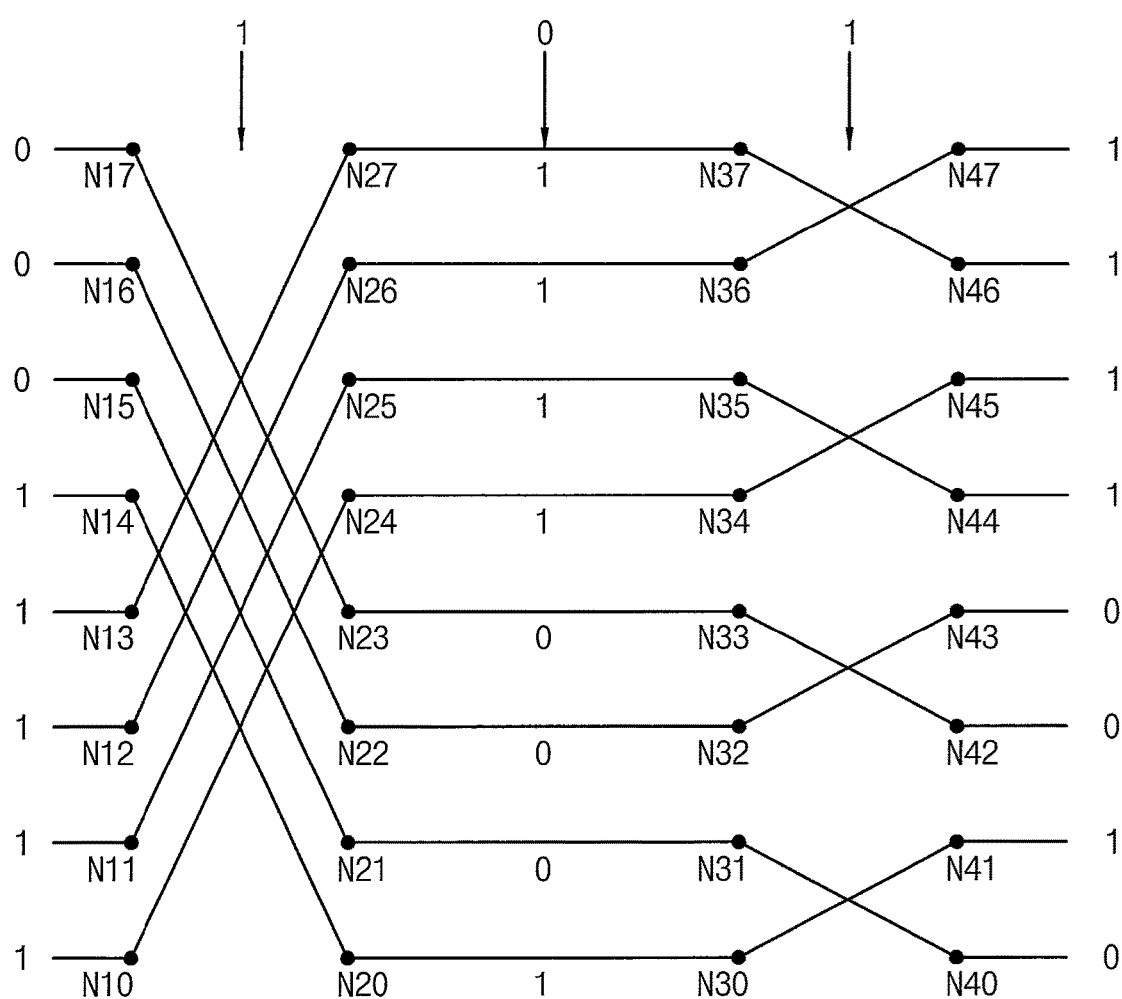

FIGS. 5A and 5B are diagrams illustrating an example of an arbitrary switch box included in a digital-to-analog converter according to example embodiments.

Referring to FIG. 5A, an arbitrary switch box 140 may change an arrangement order of input bits D0, D1, D2, D3, D4, D5, D6 and D7 to output output bits DO0, DO1, DO2, DO3, DO4, DO5, DO6 and DO7, and may include a plurality of stages ST1, ST2 and/or ST3 and a plurality of switches. According to some example embodiments, the plurality of switches may be implemented by a plurality of transistors.

Switches operating in response to the random number RN2 may connect a node N10 with one of nodes N20 and N24, may connect a node N11 with one of nodes N21 and N25, may connect a node N12 with one of nodes N22 and N26, may connect a node N13 with one of nodes N23 and N27, a node N14 with one of the nodes N20 and N24, may connect a node N15 with one of the nodes N21 and N25, may connect a node N16 with one of the nodes N22 and N26, and/or may connect a node N17 with one of the nodes N23 and N27.

Switches operating in response to the random number RN1 may connect the node N20 with one of nodes N30 and N32, may connect the node N21 with one of nodes N31 and N33, the node N22 with one of the nodes N30 and N32, may connect the node N23 with one of the nodes N31 and N33, may connect the node N24 with one of nodes N34 and N36, may connect the node N25 with one of nodes N35 and N37, may connect the node N26 with one of the nodes N34 and N36, and/or may connect the node N27 with one of the nodes N35 and N37.

Switches operating in response to the random number RN0 may connect the node N30 with one of nodes N40 and N41, may connect the node N31 with one of the nodes N40 and N41, may connect the node N32 with one of nodes N42 and N43, may connect the node N33 with one of the nodes N42 and N43, may connect the node N34 with one of nodes N44 and N45, may connect the node N35 with one of the nodes N44 and N45, may connect the node N36 with one of nodes N46 and N47, and/or may connect the node N37 with one of the nodes N46 and N47.

Referring to FIG. 5B, when the random number is 1, the switches may operate to change the arrangement order of the bits. When the random number is 0, the switches may operate to maintain the arrangement order of the bits. For example, when the random numbers RN2, RN1 and RN0 are "1," "0" and "1", respectively, the arrangement order of the input bits D0 to D7 having a value of "00011111" may be changed as illustrated, and thus the output bits DO0 to DO7 having a value of "11110010" may be provided.

However, example embodiments are not limited thereto, and a configuration and operation of the arbitrary switch box and/or the number of input/output bits may be changed according to example embodiments.

Figure 6:
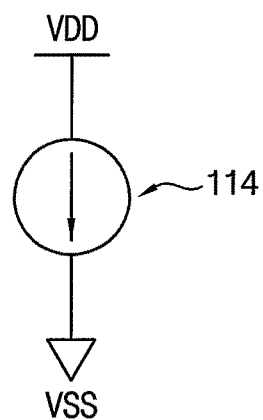
FIG. 6 is a diagram illustrating an example of a unit cell included in a digital-to-analog converter according to example embodiments.

FIG. 6 is a diagram illustrating an example of a unit cell included in a digital-to-analog converter according to example embodiments.

Referring to FIG. 6, the unit cell 112 may include a current source 114. For example, the current source 114 may be connected between a power supply voltage VDD and a ground voltage VSS. Although not illustrated in detail, the current source 114 may be selectively turned on based on one of the plurality of first row selection signals RS1, one of the plurality of second row selection signals RS2 and/or one of the plurality of column selection signals CS.

Figure 7:
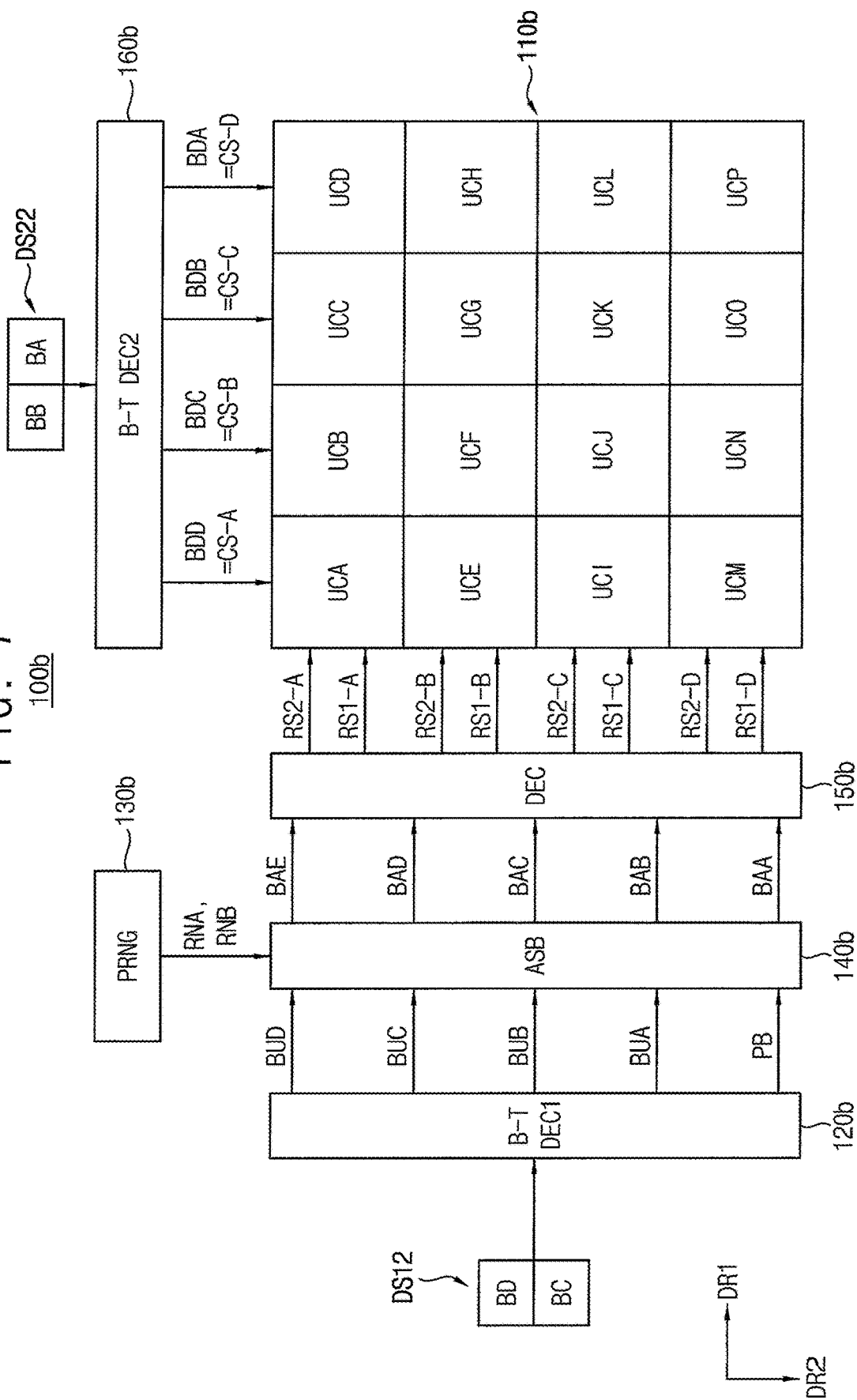
FIG. 7 is a block diagram illustrating another example of a digital-to-analog converter of FIG. 1.

FIG. 7 is a block diagram illustrating another example of a digital-to-analog converter of FIG. 1. The descriptions repeated with FIG. 2 will be omitted.

Referring to FIG. 7, a digital-to-analog converter 100b includes a current array 110b, a first binary-to-thermometer decoder 120b, a pseudo random number generator 130b, an arbitrary switch box 140b, a decoder 150b and/or a second binary-to-thermometer decoder 160b. FIG. 7 illustrates an example of randomizing only the upper 2 bits among a digital input signal of 4 bits, e.g., an example where N=4 and M=2 in FIG. 1. For convenience of illustration, a configuration corresponding to the current-to-voltage converter 170 in FIG. 1 is omitted in FIG. 7. According to some example embodiments, operations described herein as being performed by the digital-to-analog converter 100b, the first binary-to-thermometer decoder 120b, the pseudo random number generator 130b, the decoder 150b and/or the second binary-to-thermometer decoder 160b may be performed by processing circuitry.

The digital input signal of 4 bits may be separated from or divided into a first digital signal DS12 corresponding to the upper 2 bits and a second digital signal DS22 corresponding to lower 2 bits. A bit BD and a bit BA among bits BA, BB, BC and BD of the first digital signal DS12 and the second digital signal DS22 may represent a most significant bit and a least significant bit of the digital input signal, respectively.

The current array 110b may include a plurality of unit cells UCA, UCB, UCC, UCD, UCE, UCF, UCG, UCH, UCI, UCJ, UCK, UCL, UCM, UCN, UCO and UCP that are arranged along the first direction DR1 and the second direction DR2. For example, the first digital signal DS12 may include two bits BC and BD, and thus the current array 110b may include $2^2=4$ rows. The second digital signal DS22 may include two bits BA and BB, and thus the current array 110b may include $2^2=4$ columns.

The first binary-to-thermometer decoder 120b may generate $(2^2+1)=5$ first bits PB, BUA, BUB, BUC and BUD based on the bits BC and BD of the first digital signal DS12. For example, the bit PB may be the pointer bit, and the bits BUA to BUD may be bits corresponding to a value of the first digital signal DS12.

The pseudo random number generator 130b may generate 2 random numbers RNA and RNB. The arbitrary switch box 140b may change an arrangement order of the first bits PB and BUA to BUD output from the first binary-to-thermometer decoder 120b based on the random numbers RNA and RNB, and may output bits BAA, BAB, BAC, BAD and BAE.

The decoder 150b may generate 4 first row selection signals RS1-A, RS1-B, RS1-C and RS1-D and 4 second row selection signals RS2-A, RS2-B, RS2-C and RS2-D based on the bits BAA to BAE. One of the first row selection signals RS1-A to RS1-D and one of the second row selection signals RS2-A to RS2-D may be used to select a respective one row of the current array 110b.

The second binary-to-thermometer decoder 160b may generate $2^2=4$ second bits BDA, BDB, BDC and BDD and 4 column selection signals CS-A, CS-B, CS-C and CS-D that correspond to (e.g., substantially the same as) the second bits BDA to BDD based on the bits BA and BB of the second digital signal DS22. For example, the second bits BDA to BDD may be bits corresponding to a value of the second digital signal DS22.

FIGS. 8, 9A, 9B, 9C and 9D are diagrams for describing an operation of a digital-to-analog converter of FIG. 7.

Figure 8:
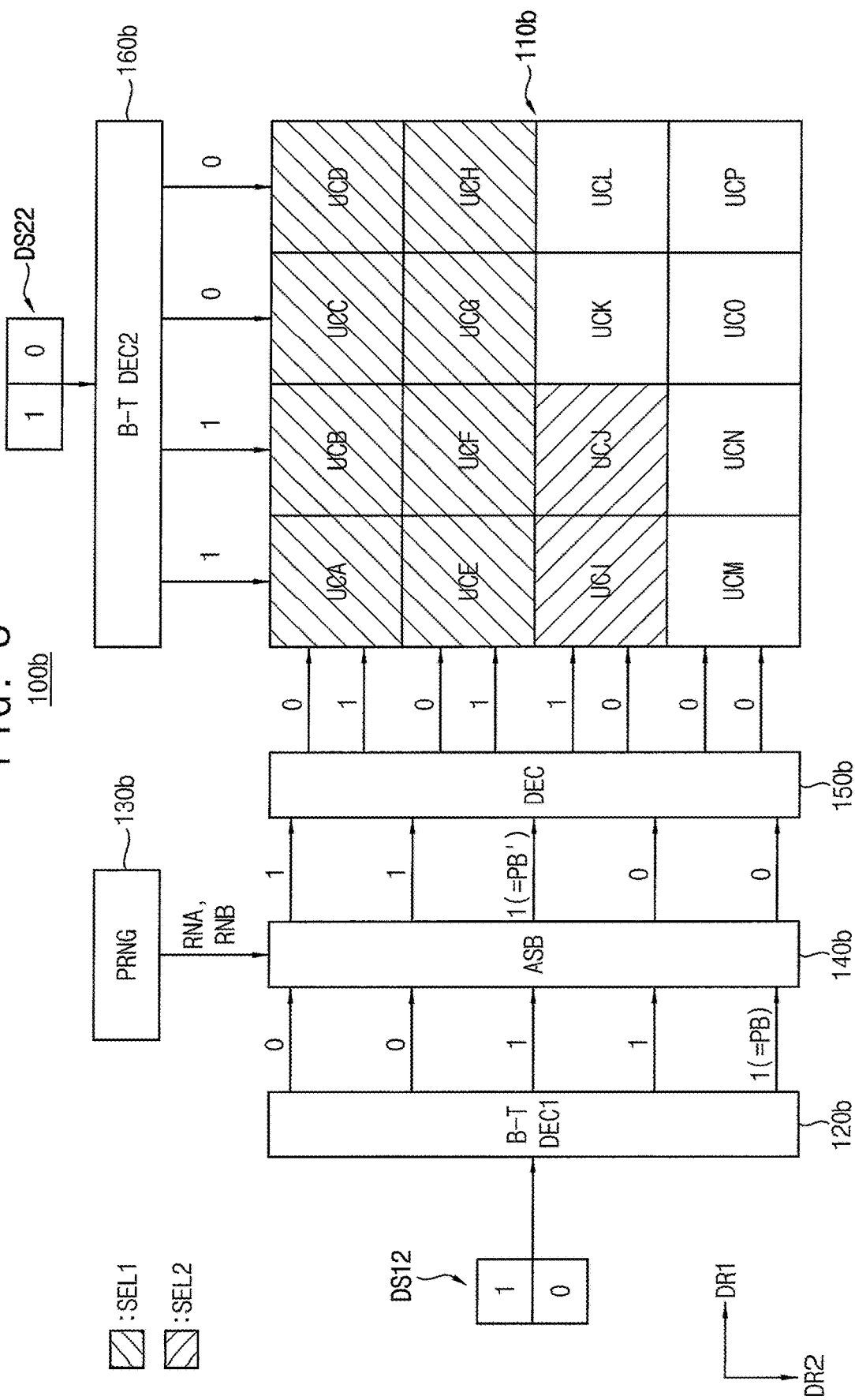

Referring to FIG. 8, when the digital input signal of 4 bits is provided as "1010," the bits BC and BD of the first digital signal DS12 may have a value of "10" corresponding to the upper 2 bits, and the bits BA and BB of the second digital signal DS22 may have a value of "10" corresponding to the lower 2 bits.

The first binary-to-thermometer decoder 120b may convert the value of "10" corresponding to the upper 2 bits into "0011," and may generate the bits BUA to BUD. In addition, the first binary-to-thermometer decoder 120b may output "00111" by adding "1," which is the bit PB, to the least significant bit. For example, the value of the first digital signal DS12 may be "10," which is expressed as decimal "2," and thus the value of the bits BUA to BUD may be set or determined to include two "1s." For example, the value of the bit PB may always be fixed to "1."

The arbitrary switch box 140b may change an arrangement order of "00111" output from the first binary-to-thermometer decoder 120b based on the random numbers RNA and RNB to output "11100." In this example, the bit BAC among the bits BAA to BAE output from the arbitrary switch box 140b may correspond to the bit PB output from the first binary-to-thermometer decoder 120b, and thus the bit BAC may be denoted as PB'.

The decoder 150b may set values of the first row selection signals RS1-A and RS1-B to "1," may set values of the first row selection signals RS1-C and RS1-D to "0," may set a value of the second row selection signal RS2-C to "1," and may set values of the second row selection signals RS2-A, RS2-B and RS2-D to "0," based on the value of "11100" output from the arbitrary switch box 140b.

The second binary-to-thermometer decoder 160b may convert the value of "10" corresponding to the lower 2 bits into "1100," and may output "1100" as the second bits BDA to BDD and the column selection signals CS-A to CS-D. For example, the value of the second digital signal DS22 may be "10," which is expressed as decimal "2," and thus the value of the bits BDA to BDD may be set or determined to include two "1s."

First and second rows of the current array 110b and the unit cells UCA to UCH included therein may be selected based on the first row selection signals RS1-A and RS1-B having a value of "1." In addition, a third row of the current array 110b may be selected based on the second row selection signal RS2-C having a value of "1," first and second columns of the current array 110b may be selected based on the column selection signals CS-A and CS-B having a value of "1," and thus the unit cells UCI and UCJ included in the third row and the first to second columns may be selected. The current signal IOUT and the analog output signal VOUT corresponding thereto may be generated based on the selected unit cells UCA to UCJ.

Hereinafter, an operation in which unit cells are randomly selected even if only the row dynamic element matching is applied and the column dynamic element matching is not applied will be described with reference to FIGS. 9A through 9D.

Figure 9A:
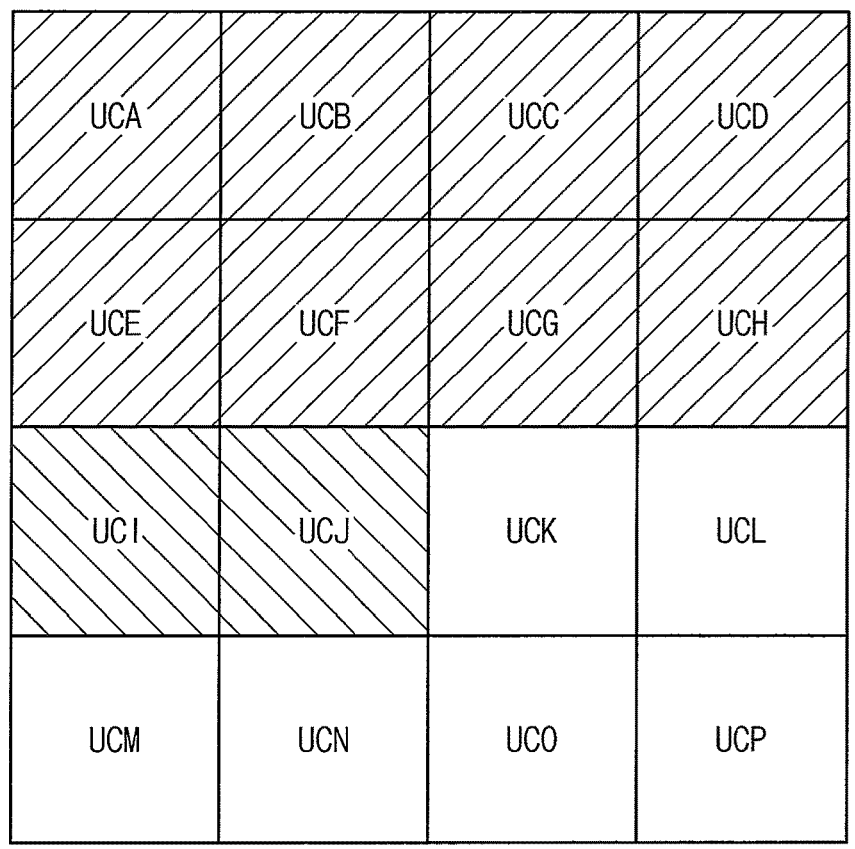

Referring to FIG. 9A, when the value of "11100" is output from the arbitrary switch box 140b as described with reference to FIG. 8, the unit cells UCA to UCH of the current array 110b may be selected based on the first row selection signals RS1-A and RS1-B, and the unit cells UCI and UCJ of the current array 110b may be selected based on the second row selection signal RS2-C and the column selection signals CS-A and CS-B.

Referring to FIG. 9B, when the value of "01110" is output from the arbitrary switch box 140b, the unit cells UCE to UCL of the current array 110b may be selected based on the first row selection signals RS1-B and RS1-C, and the unit cells UCM and UCN of the current array 110b may be selected based on the second row selection signal RS2-D and the column selection signals CS-A and CS-B.

Figure 9C:
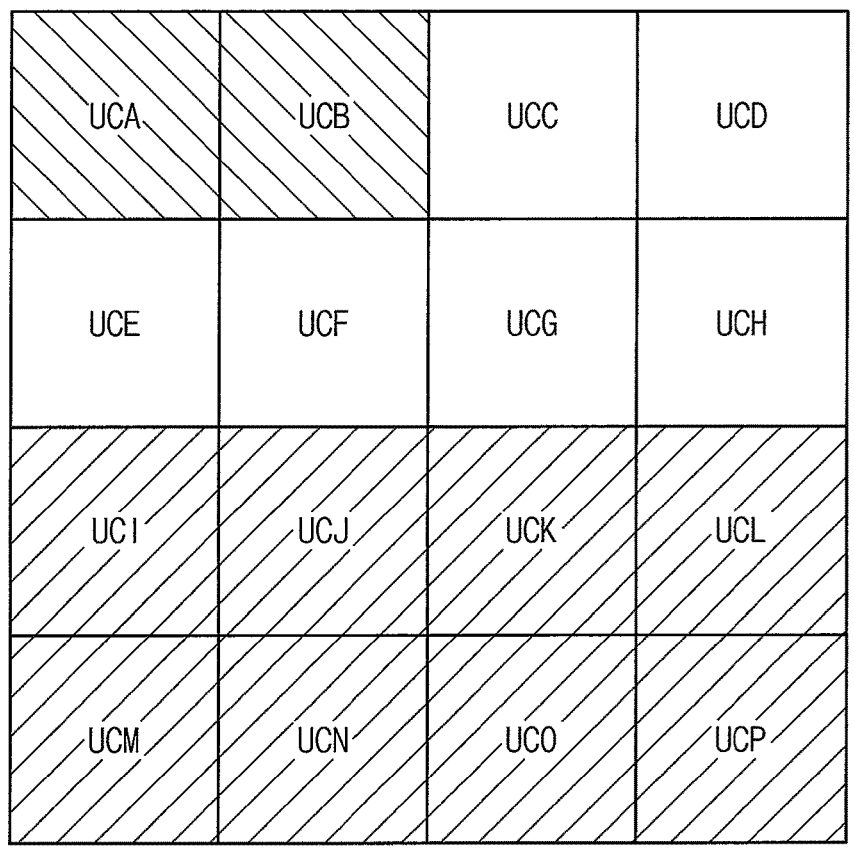

Referring to FIG. 9C, when the value of "00111" is output from the arbitrary switch box 140b, the unit cells UCI to UCP of the current array 110b may be selected based on the first row selection signals RS1-C and RS1-D, and the unit cells UCA and UCB of the current array 110b may be selected based on the second row selection signal RS2-A and the column selection signals CS-A and CS-B.

Figure 9D:
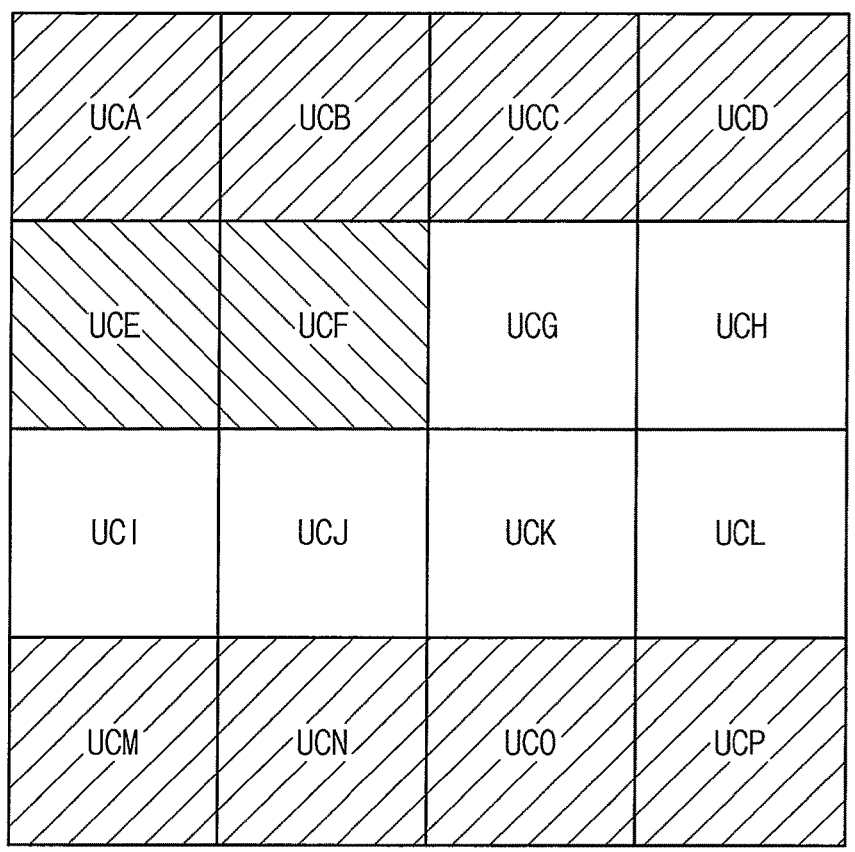

Referring to FIG. 9D, when the value of "11001" is output from the arbitrary switch box 140b, the unit cells UCA to UCD and UCM to UCP of the current array 110b may be selected based on the first row selection signals RS1-A and RS1-D, and the unit cells UCE and UCF of the current array 110b may be selected based on the second row selection signal RS2-B and the column selection signals CS-A and CS-B.

As described above, row data may be randomized as the row dynamic element matching is applied, and one of four cases illustrated in FIGS. 9A through 9D may be randomly selected based on the randomized row data. Column data may not be randomized as the column dynamic element matching is not applied, and the two leftmost unit cells may always be selected (in this example). However, since the one row selected to represent the column data is changed as the row data is randomized, the column data may be randomized into four cases similarly to the row data even if there is no additional column dynamic element matching.

Figure 10:
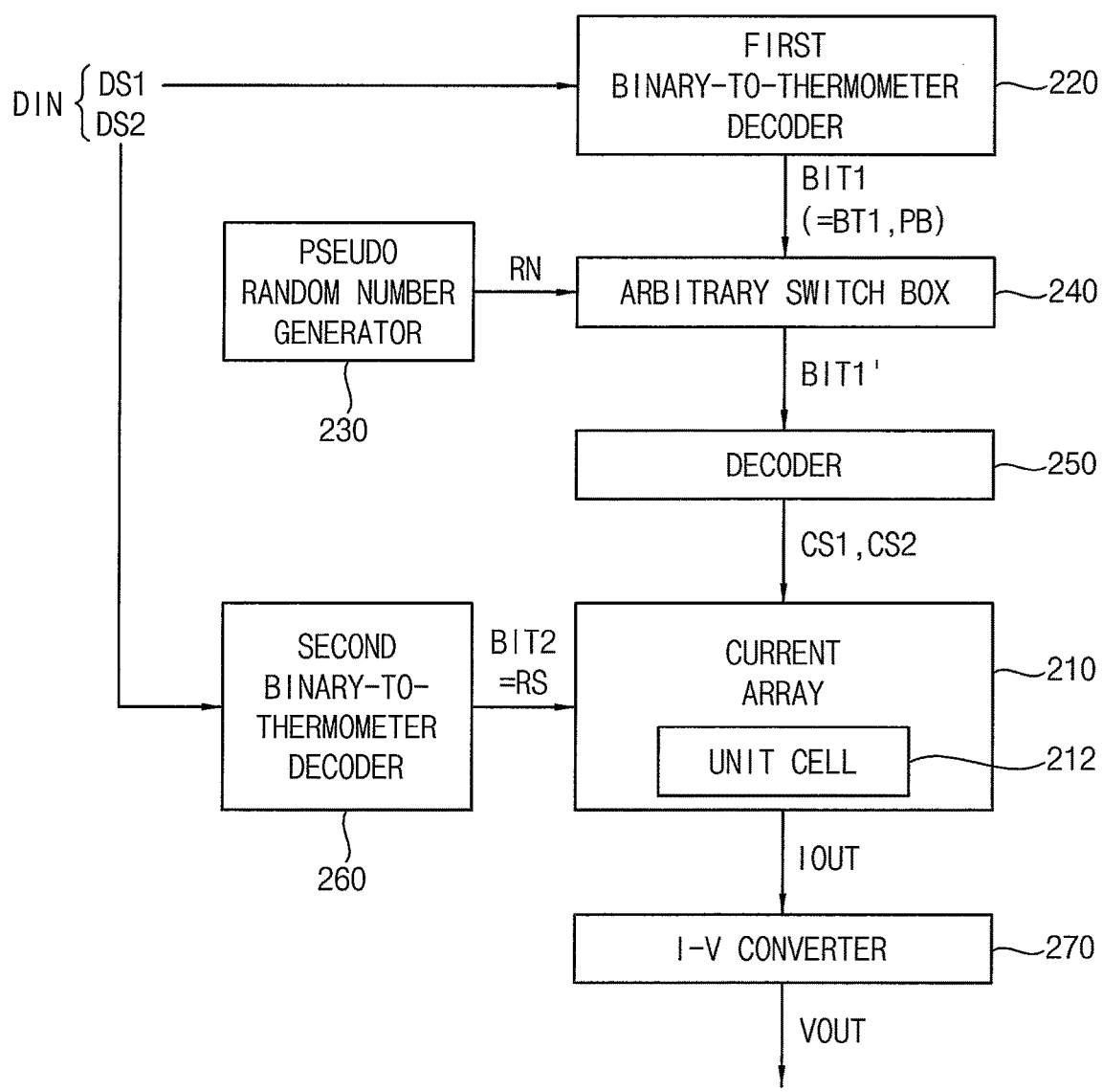
FIG. 10 is a block diagram illustrating a digital-to-analog converter for applying dynamic element matching to selection of columns of a current array according to example embodiments.

FIG. 10 is a block diagram illustrating a digital-to-analog converter according to example embodiments. The descriptions repeated with FIG. 1 will be omitted.

Referring to FIG. 10, a digital-to-analog converter 200 includes a current array 210, a first binary-to-thermometer decoder 220, a pseudo random number generator 230, an arbitrary switch box 240, a decoder 250 (may also be referred to herein as a column decoder) and/or a second binary-to-thermometer decoder 260. The digital-to-analog converter 200 may further include a current-to-voltage converter 270. According to some example embodiments, operations described herein as being performed by the digital-to-analog converter 200, the first binary-to-thermometer decoder 220, the pseudo random number generator 230, the decoder 250, the second binary-to-thermometer decoder 260 and/or the current-to-voltage converter 270 may be performed by processing circuitry.

The digital-to-analog converter 200 of FIG. 10 may be substantially the same as the digital-to-analog converter 100 of FIG. 1, except that the digital-to-analog converter 200 is implemented with a column-only dynamic element matching in which the dynamic element matching is applied only when randomly selecting columns of the current array 210 and the dynamic element matching is not applied when selecting rows of the current array 210. The current array 210, the first binary-to-thermometer decoder 220, the pseudo random number generator 230, the arbitrary switch box 240 and/or the current-to-voltage converter 270 in FIG. 10 may be substantially the same as the current array 110, the first binary-to-thermometer decoder 120, the pseudo random number generator 130, the arbitrary switch box 140 and/or the current-to-voltage converter 170 in FIG. 1, respectively.

The decoder 250 may generate a plurality of first column selection signals CS1 and a plurality of second column selection signals CS2 based on the first bits BIT1' of which the arrangement order is changed (the first bits BIT1' may also be referred to herein as a plurality of randomized first bits). According to some example embodiments, the decoder 250 may obtain the first bits BIT1' from the arbitrary switch box 240. The plurality of first column selection signals CS1 and the plurality of second column selection signals CS2 may be signals for selecting some of a plurality of columns included in the current array 210. For example, the number (e.g., quantity) of the plurality of first column selection signals CS1 and the number (e.g., quantity) of the plurality of second column selection signals CS2 may be equal or substantially equal to the number of the plurality of columns, respectively.

The second binary-to-thermometer decoder 260 may generate $2^{(N-M)}$ second bits BIT2 and/or a plurality of row selection signals RS based on a second digital signal DS2 corresponding to lower (N−M) bits other than the upper M bits among the digital input signal DIN of N bits. The plurality of row selection signals RS may correspond to the $2^{(N-M)}$ second bits BIT2. The plurality of row selection signals RS may be signals for selecting some of a plurality of rows included in the current array 210. For example, the number (e.g., quantity) of the plurality of row selection signals RS may be equal or substantially equal to the number (e.g., quantity) of the plurality of rows. According to some example embodiments, the second bits BIT2 and the plurality of row selection signals RS may be the same or substantially the same as each other. According to some example embodiments, the second binary-to-thermometer decoder 260 may generate $2^{(N-M)}$ row selection signals RS based on the lower (N−M) bits of the digital input signal DIN. According to some example embodiments, the second binary-to-thermometer decoder 260 may generate $2^{(N-M)}$ row selection signals RS based on the lower (N−M) bits of the digital input signal DIN without randomizing the lower (N−M) bits of the digital input signal DIN and/or without providing the lower (N−M) bits of the digital input signal DIN to the arbitrary switch box 240. According to some example embodiments, the second digital signal DS2 may be the same as or similar to the lower (N−M) bits of the digital input signal DIN.

In the digital-to-analog converter 200 according to example embodiments, X columns (may also be referred to herein as a subset of columns) among the plurality of columns included in the current array 210 may be randomly selected based on the plurality of first column selection signals CS1, and thus unit cells included in the X columns among a plurality of unit cells 212 (may also be referred to herein as first unit cells) may be selected. According to some example embodiments, the decoder 250 may randomly select the X columns by generating the first column selection signals CS1.

Further, in the digital-to-analog converter 200 according to example embodiments, one column among the plurality of columns included in the current array 210 may be randomly selected based on the plurality of second column selection signals CS2, Y rows (may also be referred to herein as a subset of rows) included in the one column among the plurality of rows included in the current array 210 may be selected based on the plurality of row selection signals RS, and thus unit cells included in the one column and the Y rows among the plurality of unit cells 212 (may also be referred to herein as second unit cells) may be selected.

In some example embodiments, the X columns selected based on the plurality of first column selection signals CS1 may be consecutive columns. The one column selected based on the plurality of second column selection signals CS2 may be a column arranged subsequent to the last column among the X columns. According to some example embodiments, the decoder 250 may randomly select the one column by generating the second column selection signals CS2. According to some example embodiments, the second binary-to-thermometer decoder 260 may select the Y rows by generating the plurality of row selection signals RS.

In some example embodiments, a randomization for randomly selecting the X columns may be performed by changing the arrangement order of the first bits BIT1 by the arbitrary switch box 240 (e.g., based on a randomization provided by the plurality of randomized first bits), and thus the dynamic element matching may be applied in selecting the X columns. Since the one column selected based on the plurality of second column selection signals CS2 is the column arranged subsequent to the last column among the X columns, the one column may also be randomly selected as the X columns are randomly selected, even if no additional randomization is performed. According to some example embodiments, the one row may be randomly selected based on the randomization for randomly selecting the X rows without performing additional randomization.

In some example embodiments, the Y rows selected based on the plurality of row selection signals RS and included in the one column selected based on the plurality of second column selection signals CS2 may be consecutive rows. In some example embodiments, the Y rows may be a first row through a Y-th row among rows included in the one column. In other words, the dynamic element matching may not be applied in selecting the Y rows. However, since the one column may be randomly selected as described above, an effect and/or result of randomly selecting the Y rows may be obtained even if the dynamic element matching is not applied.

The analog output signal VOUT may be generated based on the selected unit cells (e.g., the unit cells selected based on the plurality of first column selection signals CS1, the plurality of second column selection signals CS2 and the plurality of row selection signals RS).

The digital-to-analog converter 200 according to example embodiments may include the current array 210 in which the plurality of unit cells 212 are two-dimensionally arranged, may select some columns of the current array 210 based on the first digital signal DS1 corresponding to the upper bits of the digital input signal DIN, may select some rows of the current array 210 based on the second digital signal DS2 corresponding to the lower bits of the digital input signal DIN, and may be implemented with a column-only dynamic element matching in which the dynamic element matching is applied only when randomly selecting the columns based on the upper bits without applying the dynamic element matching when selecting the rows based on the lower bits. In this example, the lower bits may be automatically randomized even if only the upper bits are randomized. Accordingly, as compared with a conventional row-column dynamic element matching in which all bits of the digital input signal are randomized, the size of hardware (particularly, the size of the arbitrary switch box 240) may be reduced while having nearly the same performance, thereby operating with high speed, high resolution and/or low power.

Figure 11:
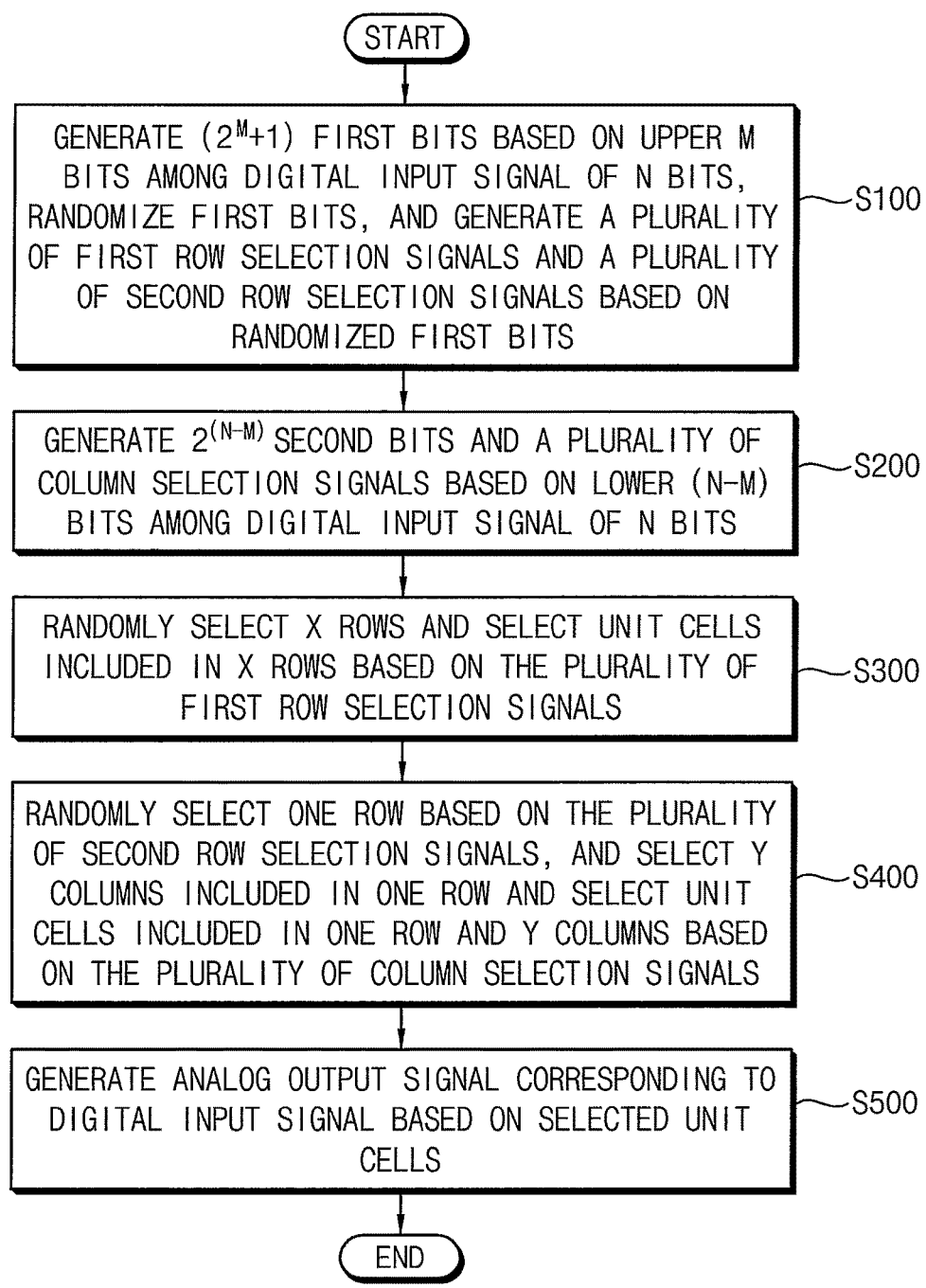
FIGS. 11 and 12 are flowcharts illustrating digital-to-analog conversion methods according to example embodiments.
Figure 12:
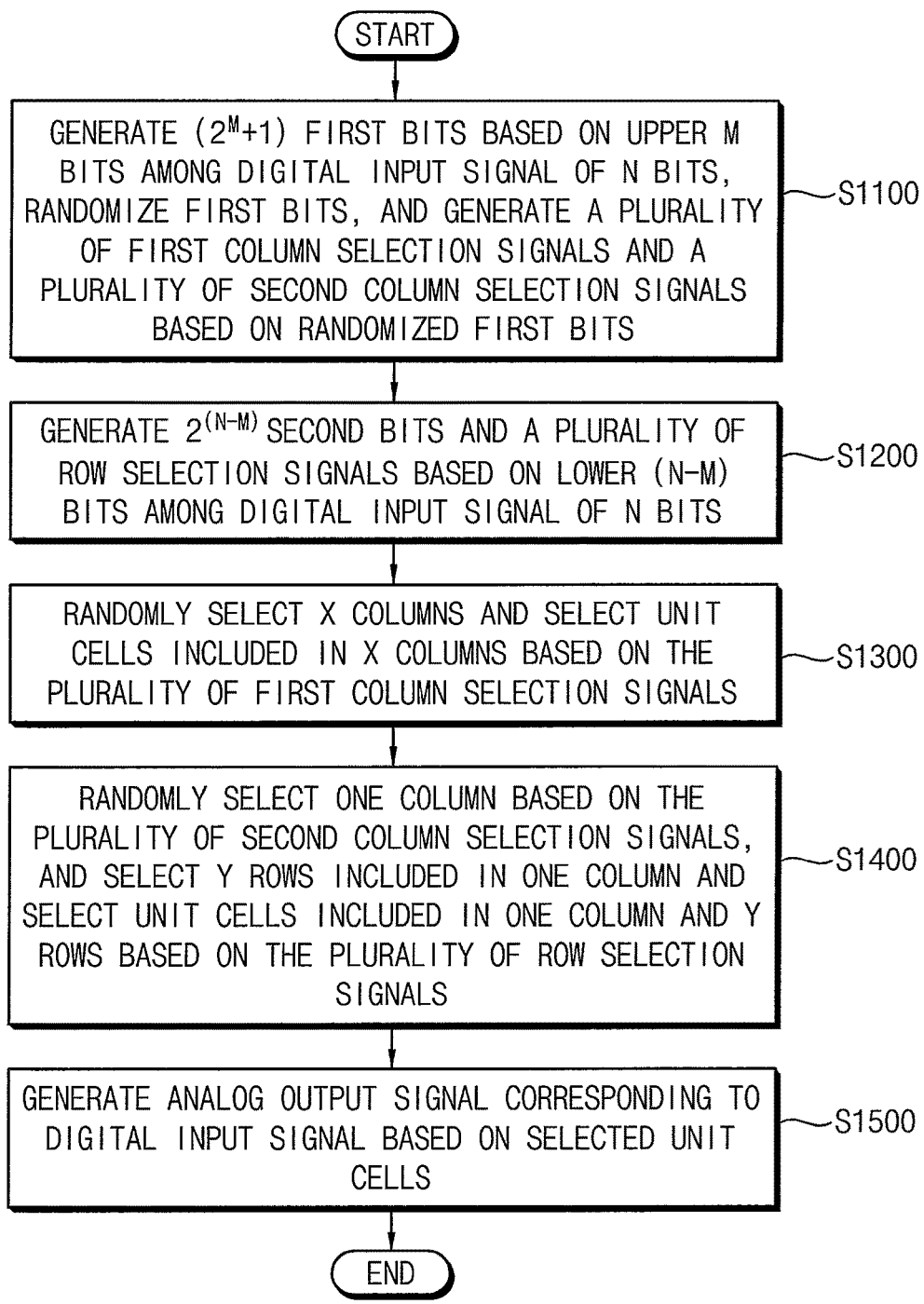

FIGS. 11 and 12 are flowcharts illustrating a digital-to-analog conversion method according to example embodiments.

Referring to FIGS. 1 and 11, in a digital-to-analog conversion method according to example embodiments, the $(2^M+1)$ first bits BIT1 may be generated based on the upper M bits among the digital input signal DIN of N bits, the first bits BIT1 may be randomized, and the plurality of first row selection signals RS1 and the plurality of second row selection signals RS2 may be generated based on the randomized first bits BIT1' (operation S100). The $2^{(N-M)}$ second bits BIT2 and the plurality of column selection signals CS may be generated based on the lower (N–M) bits among the digital input signal DIN of N bits (operation S200).

The X rows may be randomly selected and the unit cells included in the X rows may be selected based on the plurality of first row selection signals RS1 (operation S300). The one row may be randomly selected based on the plurality of second row selection signals RS2, and the Y columns included in the one row may be selected and the unit cells included in the one row and the Y columns may be selected based on the plurality of column selection signals CS (operation S400). The analog output signal VOUT corresponding to the digital input signal DIN may be generated based on the selected unit cells (operation S500). According to some example embodiments, the digital-to-analog conversion method of FIG. 11 may be implemented by the digital-to-analog converter 100, the digital-to-analog converter 100a and/or digital-to-analog converter 100b.

Referring to FIGS. 10 and 12, in a digital-to-analog conversion method according to example embodiments, the $(2^M+1)$ first bits BIT1 may be generated based on the upper M bits among the digital input signal DIN of N bits, the first bits BIT1 may be randomized, and the plurality of first column selection signals CS1 and the plurality of second column selection signals CS2 may be generated based on the randomized first bits BIT1' (operation S1100). The $2^{(N-M)}$ second bits BIT2 and the plurality of row selection signals RS may be generated based on the lower (N–M) bits among the digital input signal DIN of N bits (operation S1200).

The X columns may be randomly selected and the unit cells included in the X columns may be selected based on the plurality of first column selection signals CS1 (operation S1300). The one column may be randomly selected based on the plurality of second column selection signals CS2, and the Y rows included in the one column may be selected and the unit cells included in the one column and the Y rows may be selected based on the plurality of row selection signals RS (operation S1400). The analog output signal VOUT corresponding to the digital input signal DIN may be generated based on the selected unit cells (operation S1500). According to some example embodiments, the digital-to-analog conversion method of FIG. 12 may be implemented by the digital-to-analog converter 200.

Figure 13:
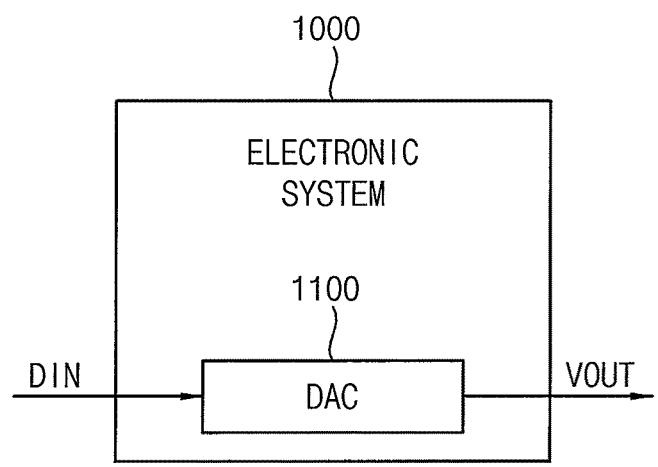
FIGS. 13 and 14 are block diagrams illustrating an electronic system including a digital-to-analog converter according to example embodiments.
Figure 14:
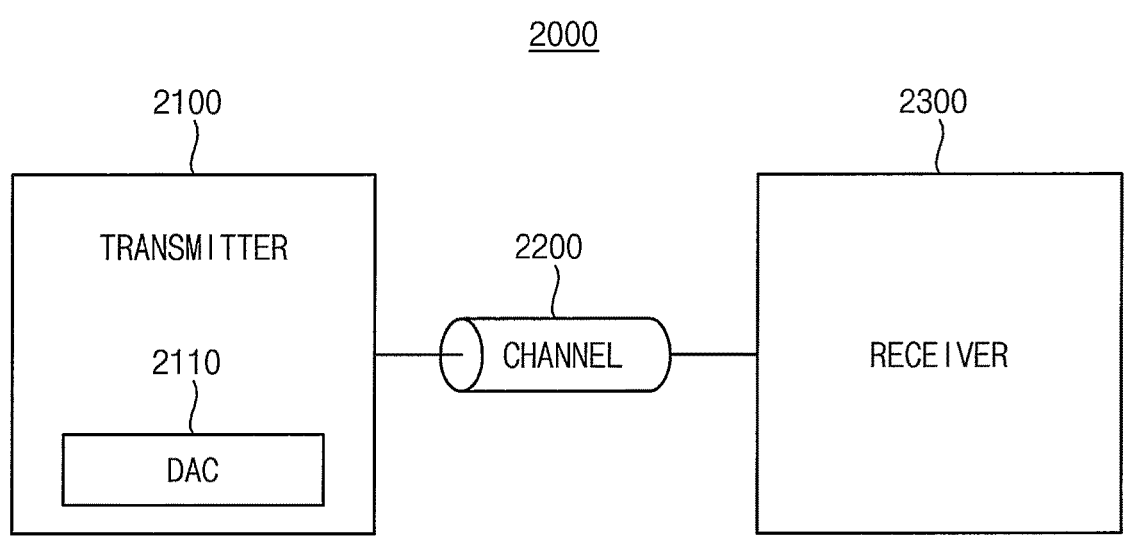

FIGS. 13 and 14 are block diagrams illustrating an electronic system including a digital-to-analog converter according to example embodiments.

Referring to FIG. 13, an electronic system 1000 includes a digital-to-analog converter 1100.

The digital-to-analog converter 1100 may generate an analog output signal VOUT based on a digital input signal DIN. The digital-to-analog converter 1100 may be a digital-to-analog converter according to example embodiments described with reference to FIGS. 1 through 10. For example, the digital input signal DIN may be provided from inside and/or outside of the electronic system 1000, and the analog output signal VOUT may be provided to inside and/or outside of the electronic system 1000.

In some example embodiments, the electronic system 1000 may be any computing system, such as a personal computer (PC), a server computer, a data center, a workstation, a digital television, a set-top box, a navigation system, etc. In some example embodiments, the electronic system 1000 may be any mobile system, such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Referring to FIG. 14, an electronic system 2000 includes a transmitter 2100, a communication channel 2200 and/or a receiver 2300. For example, the electronic system 2000 may be any communication system.

The transmitter 2100 may transmit a communication signal to the receiver 2300 via the communication channel 2200. The transmitter 2100 may include a digital-to-analog converter 2110 that is used for generating the communication signal. The digital-to-analog converter 2110 may be a digital-to-analog converter according to example embodiments described with reference to FIGS. 1 through 10. Although not illustrated in detail, the transmitter 2100 may further include a driver, a serializer, a clock generator, etc.

The receiver 2300 may receive and recover (or restore) the communication signal provided via the communication channel 2200.

Figure 15:
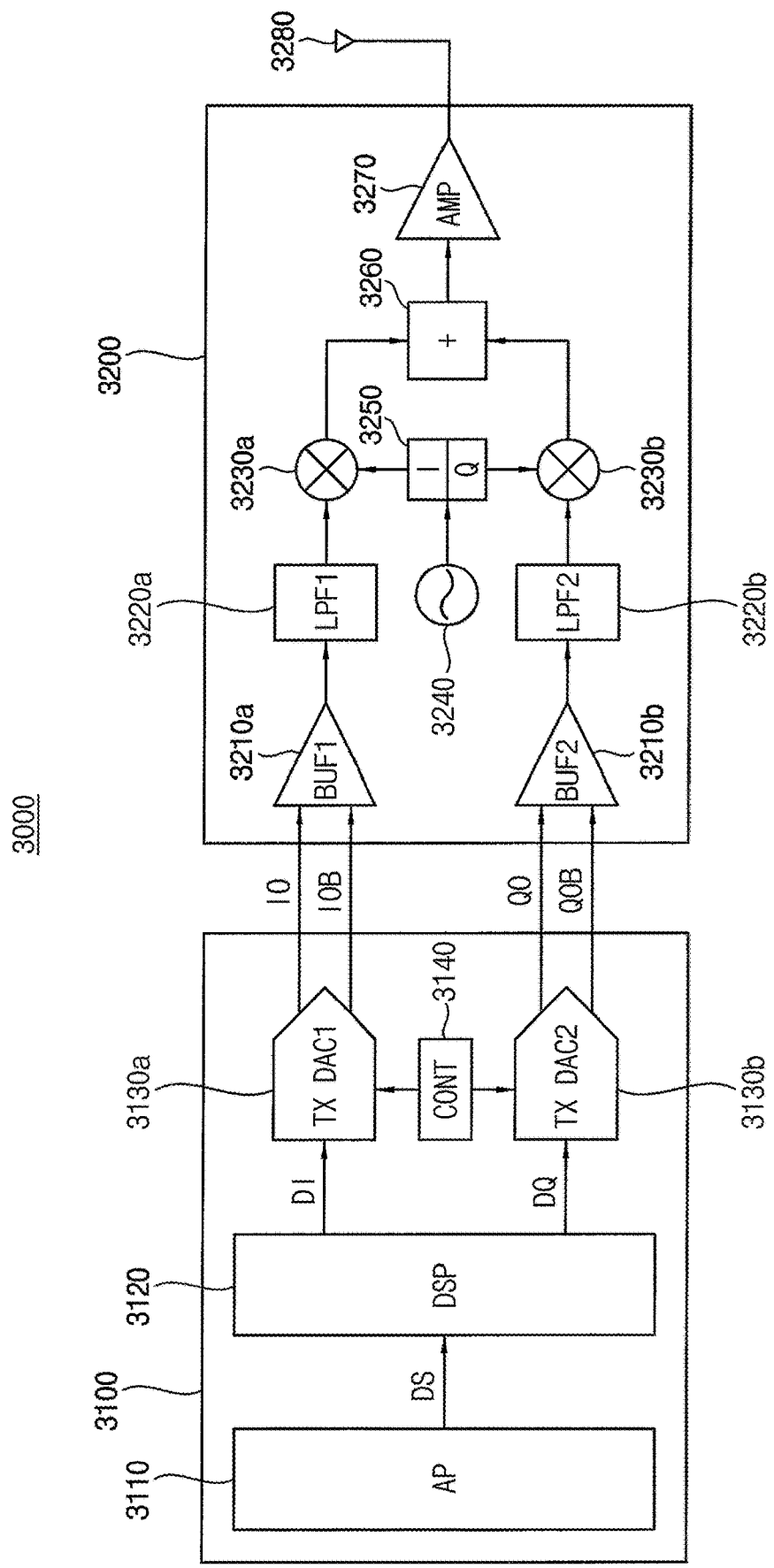
FIG. 15 is a block diagram illustrating an example of a transmitter included in an electronic system of FIG. 14.

FIG. 15 is a block diagram illustrating an example of a transmitter included in an electronic system of FIG. 14.

Referring to FIG. 15, a transmitter 3000 may include a processor chip 3100 and a communication chip 3200 that are different, separated and distinguished (or distinct) from each other.

The processor chip 3100 may include an application processor (AP) 3110, a digital signal processor (DSP) 3120, a first digital-to-analog converter (TX DAC1) 3130a, a second digital-to-analog converter (TX DAC2) 3130b and/or a controller (CONT) 3140. For example, the processor chip 3100 may be implemented in the form of a system-on-chip (SoC). According to some example embodiments, operations described herein as being performed by the application processor 3110, the digital signal processor 3120, the first digital-to-analog converter 3130a, the second digital-to-analog converter 3130b and/or the controller (CONT) 3140 may be performed by processing circuitry.

The application processor 3110 may generate digital data DS to be transmitted. The digital signal processor 3120 may generate a first digital input signal DI and a second digital input signal DQ based on the digital data DS. The first digital-to-analog converter 3130a may generate first analog output signals IO and IOB based on the first digital input signal DI. The second digital-to-analog converter 3130b may generate second analog output signals QO and QOB based on the second digital input signal DQ. The controller 3140 may generate control signals for controlling the first and second digital-to-analog converters 3130a and 3130b.

Each of the first and second digital-to-analog converters 3130a and 3130b may be a digital-to-analog converter according to example embodiments described with reference to FIGS. 1 through 10. The first analog output signals IO and IOB and the second analog output signals QO and QOB may be differential signals, respectively. The first and second digital-to-analog converters 3130a and 3130b, and the controller 3140, may form or may be implemented as an analog front-end (AFE).

In some example embodiments, each of the first digital input signal DI and the first analog output signals IO and IOB may be a signal of in-phase component or simply an in-phase signal, and each of the second digital input signal DQ and the second analog output signals QO and QOB may be a signal of quadrature component or simply a quadrature signal.

The communication chip 3200 may include a first buffer (BUF1) 3210a, a first low pass filter (LPF1) 3220a, a first mixer 3230a, a second buffer (BUF2) 3210b, a second low pass filter (LPF2) 3220b, a second mixer 3230b, an oscillator 3240, an oscillation controller 3250, an adder 3260, an amplifier (AMP) 3270 and/or an antenna 3280. For example, the communication chip 3200 may be a radio frequency (RF) chip. According to some example embodiments, operations described herein as being performed by the first low pass filter 3220a, the first mixer 3230a, the second low pass filter 3220b, the second mixer 3230b, the oscillation controller 3250, the adder 3260 and/or the amplifier 3270 may be performed by processing circuitry.

The first buffer 3210a may buffer the first analog output signals IO and IOB. The first low pass filter 3220a may filter an output of the first buffer 3210a. The second buffer 3210b may buffer the second analog output signals QO and QOB. The second low pass filter 3220b may filter an output of the second buffer 3210b. The oscillator 3240 may generate an oscillation signal. The oscillation controller 3250 may generate a first oscillation signal and a second oscillation signal based on the oscillation signal. The first mixer 3230a may combine (or mix) an output of the first low pass filter 3220a and the first oscillation signal. The second mixer 3230b may combine an output of the second low pass filter 3220b and the second oscillation signal. The adder 3260 may add an output of the first mixer 3230a and an output of the second mixer 3230b. The amplifier 3270 may generate a communication signal corresponding to the digital data DS based on an output of the adder 3260. The antenna 3280 may output the communication signal. According to some example embodiments, the transmitter 2100 may be implemented by the transmitter 3000 and the communication signal may be provided to the receiver 2300 via the communication channel 2200.

Although not illustrated in detail, the processor chip 3100 and the communication chip 3200 may be implemented as one chip according to example embodiments.

Figure 16:
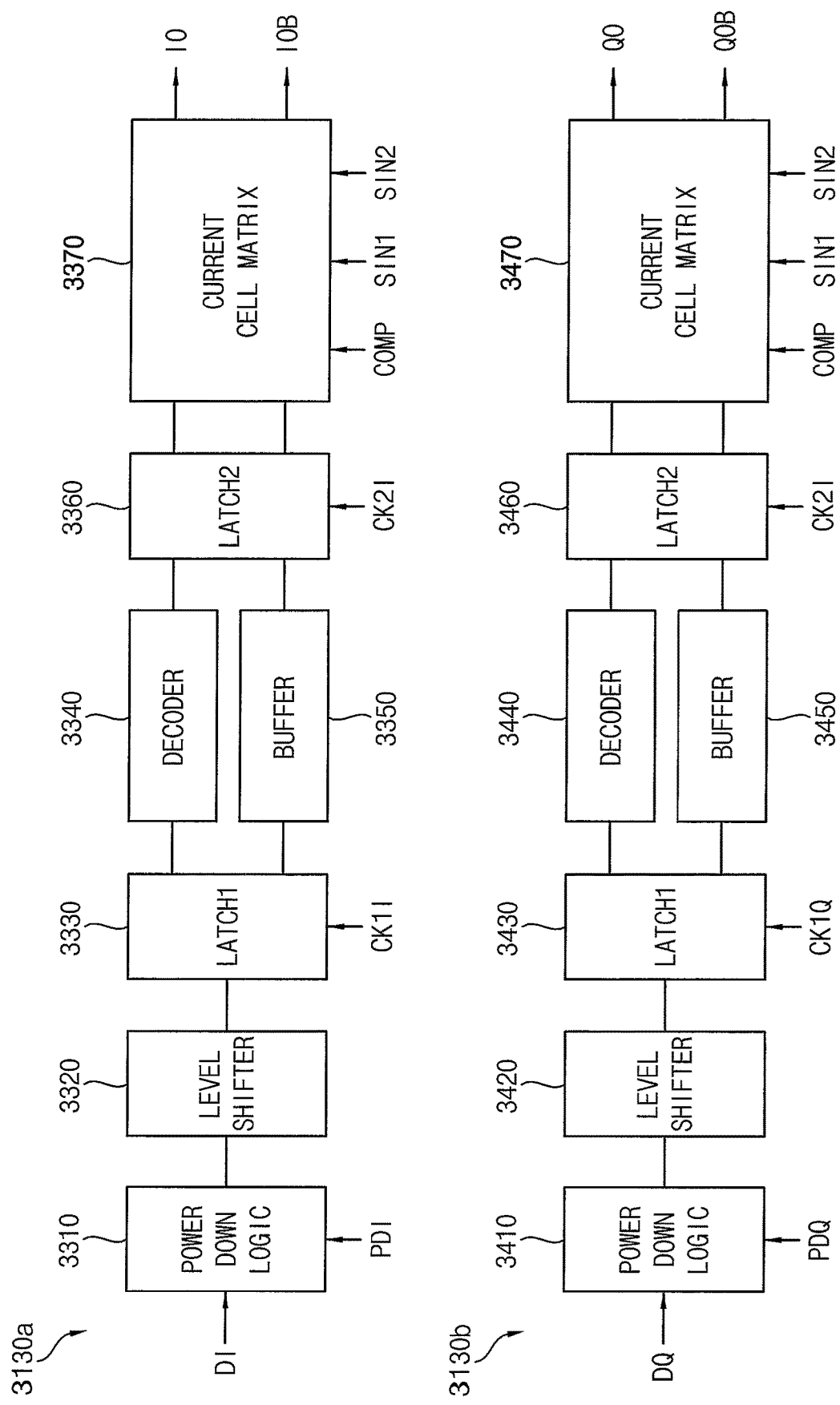
FIG. 16 is a block diagram illustrating an example of first and second digital-to-analog converters included in a transmitter of FIG. 15.

FIG. 16 is a block diagram illustrating an example of first and second digital-to-analog converters included in a transmitter of FIG. 15.

Referring to FIG. 16, the first digital-to-analog converter 3130a may include a power down logic 3310, a level shifter 3320, a first latch 3330, a first decoder 3340, a buffer 3350, a second latch 3360 and/or a current cell matrix 3370.

According to some example embodiments, operations described herein as being performed by the power down logic 3310, the level shifter 3320 and/or the first decoder 3340 may be performed by processing circuitry.

The power down logic 3310 may power down the first digital input signal DI based on a control signal PDI. The level shifter 3320 may level shift an output of the power down logic 3310. The first latch 3330 may latch an output of the level shifter 3320 based on a clock signal CK1I. The first decoder 3340 may decode a first output of the first latch 3330. The buffer 3350 may buffer a second output of the first latch 3330. The second latch 3360 may latch an output of the first decoder 3340 and an output of the buffer 3350. The current cell matrix 3370 may generate the first analog output signals IO and IOB based on control signals COMP, SIN1 and SIN2 and outputs of the second latch 3360.

In some example embodiments, among the components included in a digital-to-analog converter according to example embodiments described with reference to FIGS. 1 through 10, the current array may be included in the current cell matrix 3370, and the first binary-to-thermometer decoder, the decoder and the second binary-to-thermometer decoder may be included in the first decoder 3340.

The second digital-to-analog converter 3130b may include a power down logic 3410, a level shifter 3420, a first latch 3430, a first decoder 3440, a buffer 3450, a second latch 3460 and/or a current cell matrix 3470. A configuration and operation of the second digital-to-analog converter 3130b may be substantially the same as those of the first digital-to-analog converter 3130a, except that some control signal PDQ and clock signals CK1Q and CK2Q may be changed. Thus, the repeated descriptions will be omitted. According to some example embodiments, operations described herein as being performed by the power down logic 3410, the level shifter 3420 and/or the first decoder 3440 may be performed by processing circuitry.

Figure 17:
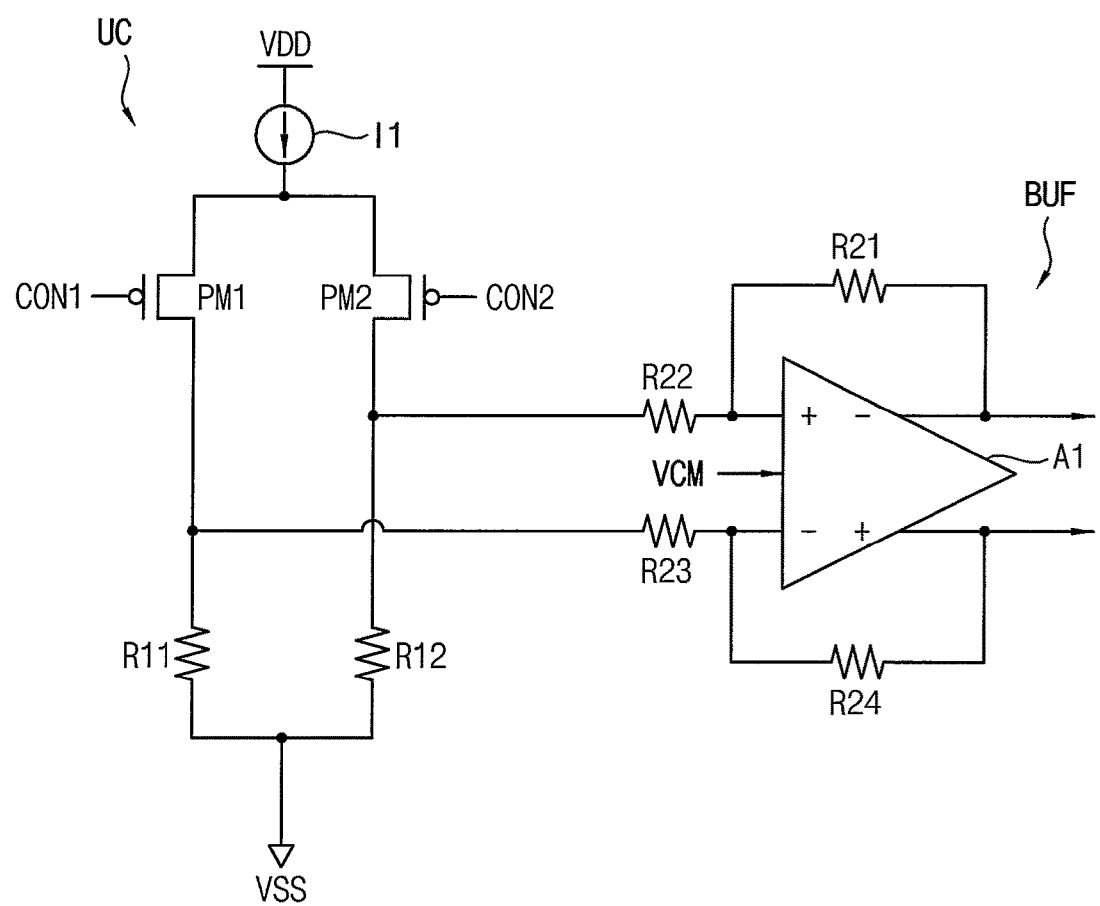
FIG. 17 is a circuit diagram illustrating some components included in a transmitter of FIG. 15 in detail.

FIG. 17 is a circuit diagram illustrating some components included in a transmitter of FIG. 15 in detail. FIG. 17 illustrates a circuit structure of one unit cell UC included in the current cell matrix 3370 in FIG. 16 and a buffer BUF connected thereto.

Referring to FIG. 17, the unit cell UC may have a structure in which a current source Il, transistors PM1 and PM2 and/or resistors R11 and R12 are connected as illustrated between a power supply voltage VDD and a ground voltage VSS, and may receive control signals CON1 and CON2. The buffer BUF may have a structure in which an amplifier A1 receiving a reference voltage VCM and/or resistors R21, R22, R23 and R24 are connected as illustrated. However, example embodiments are not limited thereto, and the circuit structure of the unit cell UC and the buffer BUF may be changed according to example embodiments.

The inventive concepts may be applied to various electronic devices and communication systems including a digital-to-analog converter. For example, the inventive concepts may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The various operations of methods described above may be performed by any suitable device capable of performing the operations, such as processing circuitry. For example, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with some example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of example embodiments and is not to be construed as limiting thereof. Although some example embodiments have been described, those skilled in the art will readily appreciate that many modifications are possible without materially departing from the novel teachings and advantages thereof. Accordingly, all such modifications are intended to be included within the scope of some example embodiments as defined in the claims. Therefore, it is to be understood that the foregoing is illustrative of various example embodiments and is not to be construed as limited to the specific examples disclosed, and that modifications to some example embodiments are intended to be included within the scope of the appended claims.

What is claimed is:

1. A digital-to-analog converter (DAC) comprising:
   a current array including a plurality of unit cells, the plurality of unit cells being arranged in a matrix formation including a plurality of rows and a plurality of columns;
   an arbitrary switch box configured to change an arrangement order of bits based on a random number; and
   processing circuitry configured to
      generate ($2^M$+1) first bits based on an upper M bits of a digital input signal of N bits, N being an integer greater than or equal to two and M being an integer less than N,
      generate a plurality of first row selection signals and a plurality of second row selection signals based on a plurality of randomized first bits, the plurality of randomized first bits being obtained from the arbitrary switch box based on the ($2^M$+1) first bits,
      generate $2^{(N-M)}$ column selection signals based on a lower (N−M) bits of the digital input signal,
      randomly select a subset of rows among the plurality of rows based on the plurality of first row selection signals, the subset of rows including first unit cells among the plurality of unit cells,
      randomly select one row among the plurality of rows based on the plurality of second row selection signals,
      select a subset of columns among the plurality of columns based on the $2^{(N-M)}$ column selection signals, second unit cells among the plurality of unit cells being included in both the one row and the subset of columns, and generate an analog output signal corresponding to the digital input signal based on the first unit cells and the second unit cells.

2. The digital-to-analog converter of claim 1, wherein the subset of rows are consecutive rows; and the one row a row subsequent to a last row among the subset of rows.

3. The digital-to-analog converter of claim 2, wherein the arbitrary switch box is configured to generate the plurality of randomized first bits by randomly changing the arrangement order of of the ($2^M$+1) first bits; and the processing circuitry is configured to randomly select the subset of rows based on a randomization provided by the plurality of randomized first bits, and randomly select the one row based on the randomization without performing additional randomization.

4. The digital-to-analog converter of claim 2, wherein the subset of columns selected are consecutive columns.

5. The digital-to-analog converter of claim 4, wherein the subset of columns are a first column through a Y-th column among the plurality of columns included in the one row, Y being a positive integer.

6. The digital-to-analog converter of claim 1, wherein the processing circuitry is configured to generate the analog output signal based on a current signal generated by the first unit cells and the second unit cells.

7. The digital-to-analog converter of claim 1, wherein $2^M$ bits among the ($2^M$+1) first bits correspond to a value of the upper M bits of the digital input signal; and one bit not included in the $2^M$ bits among the ($2^M$+1) first bits is a pointer bit for a dynamic element matching (DEM).

8. The digital-to-analog converter of claim 7, wherein a quantity of bits having a first bit value among the $2^M$ bits is equal to the value of the upper M bits of the digital input signal.

9. The digital-to-analog converter of claim 7, wherein the pointer bit always has a first bit value.

10. The digital-to-analog converter of claim 7, wherein the one row is selected based on the pointer bit.

11. The digital-to-analog converter of claim 1, wherein processing circuitry is configured to generate $2^{(N-M)}$ second bits corresponding to a value of the lower (N–M) bits of the digital input signal, the $2^{(N-M)}$ column selection signals corresponding to the $2^{(N-M)}$ second bits.

12. The digital-to-analog converter of claim 11, wherein a quantity of bits having a first bit value among the $2^{(N-M)}$ second bits is equal to the value of the lower (N–M) bits of the digital input signal.

13. The digital-to-analog converter of claim 1, wherein the arbitrary switch box is configured to change an arrangement order of bits based on a quantity of random numbers equal to M.

14. The digital-to-analog converter of claim 13, wherein the arbitrary switch box includes at least one stage and a plurality of switches.

15. The digital-to-analog converter of claim 14, wherein a number of the at least one stage included in the arbitrary switch box is equal to M.

16. The digital-to-analog converter of claim 1, wherein each of the plurality of unit cells includes a current source.

17. A digital-to-analog converter (DAC) comprising:

a current array including a plurality of unit cells, the plurality of unit cells being arranged in a matrix formation including a plurality of rows and a plurality of columns;

an arbitrary switch box configured to change an arrangement order of bits based on a random number; and processing circuitry configured to generate ($2^M$+1) first bits based on an upper M bits of a digital input signal of N bits, N being an integer greater than or equal to two and M being an integer less than N, generate a plurality of first column selection signals and a plurality of second column selection signals based on a plurality of randomized first bits, the plurality of randomized first bits being obtained from the arbitrary switch box based on the ($2^M$+1) first bits, generate $2^{(N-M)}$ row selection signals based on a lower (N–M) bits of the digital input signal, randomly select a subset of columns among the plurality of columns based on the plurality of first column selection signals, the subset of columns including first unit cells among the plurality of unit cells, randomly select one column among the plurality of columns based on the plurality of second column selection signals, select a subset of rows among the plurality of rows based on the $2^{(N-M)}$ row selection signals, second unit cells among the plurality of unit cells being included in both the one column and the subset of rows, and generate an analog output signal corresponding to the digital input signal based on the first unit cells and the second unit cells.

18. The digital-to-analog converter of claim 17, wherein the subset of columns are consecutive columns, the one column is a column subsequent to a last column among the subset of columns;

the arbitrary switch box is configured to generate the plurality of randomized first bits by randomly changing the arrangement order of the ($2^M$+1) first bits; and the processing circuitry is configured to randomly select the subset of columns based on a randomization provided by the plurality of randomized first bits, and randomly select the one column based on the randomization without performing additional randomization.

19. An electronic system comprising:

a first digital-to-analog converter (DAC) configured to generate a first analog output signal based on a first digital input signal, wherein the first digital-to-analog converter includes a current array including a plurality of unit cells, the plurality of unit cells being in a matrix formation including a plurality of rows and a plurality of columns, an arbitrary switch box configured to change an arrangement order of bits based on a random number, and processing circuitry configured to generate ($2^M$+1) first bits based on an upper M bits among the first digital input signal of N bits, N being an integer greater than or equal to two and M being an integer less than N, generate a plurality of first row selection signals and a plurality of second row selection signals based on a plurality of randomized first bits, the plurality of randomized first bits being obtained from the arbitrary switch box based on ($2^M+1$) first bits, generate $2^{(N-M)}$ column selection signals based on a lower (N–M) bits of the first digital input signal, randomly select a subset of rows among the plurality of rows based on the plurality of first row selection signals, the subset of rows including first unit cells among the plurality of unit cells, randomly select one row among the plurality of rows based on the plurality of second row selection signals, select a subset of columns among the plurality of columns based on the $2^{(N-M)}$ column selection signals, second unit cells among the plurality of unit cells being included in both the one row and the subset of columns, and generate the first analog output signal based on the first unit cells and the second unit cells.

20. The electronic system of claim 19, further comprising:

an application processor (AP) configured to generate digital data to be transmitted;

a digital signal processor (DSP) configured to generate the first digital input signal and a second digital input signal based on the digital data; and a second digital-to-analog converter configured to generate a second analog output signal based on the second digital input signal.

* * * * *